(12) United States Patent
Kim et al.

(10) Patent No.: US 7,535,467 B2
(45) Date of Patent: May 19, 2009

(54) ANALOG BUFFER, DISPLAY DEVICE HAVING THE SAME, AND METHOD OF DRIVING THE SAME

(75) Inventors: Cheol-Min Kim, Seongnam-si (KR); Hyun-Jae Kim, Seongnam-si (KR); Il-Gon Kim, Seoul (KR); Kook-Chul Moon, Yongin-si (KR); Chul-Ho Kim, Seoul (KR); Kee-Chan Park, Suwon-si (KR); Su-Gyeong Lee, Seoul (KR); Tae-Hyeong Park, Yongin-si (KR); Jin-Young Choi, Seoul (KR); Hyun-Sook Shim, Seongnam-si (KR); Oh-Kyong Kwon, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 636 days.

(21) Appl. No.: 11/122,769

(22) Filed: May 5, 2005

(65) Prior Publication Data
US 2005/0258997 A1   Nov. 24, 2005

(30) Foreign Application Priority Data
May 11, 2004   (KR) ..................... 10-2004-0033083

(51) Int. Cl.
*G09G 5/00* (2006.01)

(52) U.S. Cl. ..................... 345/204; 345/690; 345/55

(58) Field of Classification Search ............... 345/204, 345/690, 55
See application file for complete search history.

(56) References Cited

U.S. PATENT DOCUMENTS 3,858,199 A * 12/1974 Neuner et al. ............... 341/132

FOREIGN PATENT DOCUMENTS

JP   11-296143   * 11/1999

* cited by examiner

*Primary Examiner*—Richard Hjerpe
*Assistant Examiner*—Leonid Shapiro
(74) *Attorney, Agent, or Firm*—F. Chau & Associates, LLC

(57) ABSTRACT

An analog buffer, display device having the same and a method of driving the same are provided. The analog buffer applies an analog voltage to a load. The analog buffer includes a comparator and a transistor. The comparator is configured to compare an input voltage provided from an external device with the analog voltage applied to the load. The transistor is turned on to electrically charge the load when the analog voltage is lower than the input voltage or turned on to electrically discharge the load when the analog voltage is higher than the input voltage, and turned off when the analog voltage becomes substantially the same as the input voltage.

5 Claims, 20 Drawing Sheets

FIG. 9
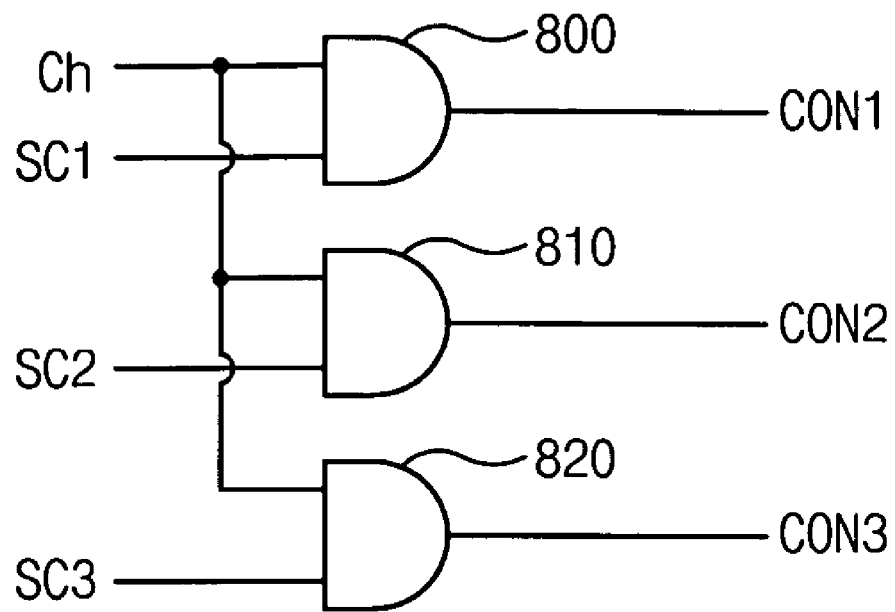
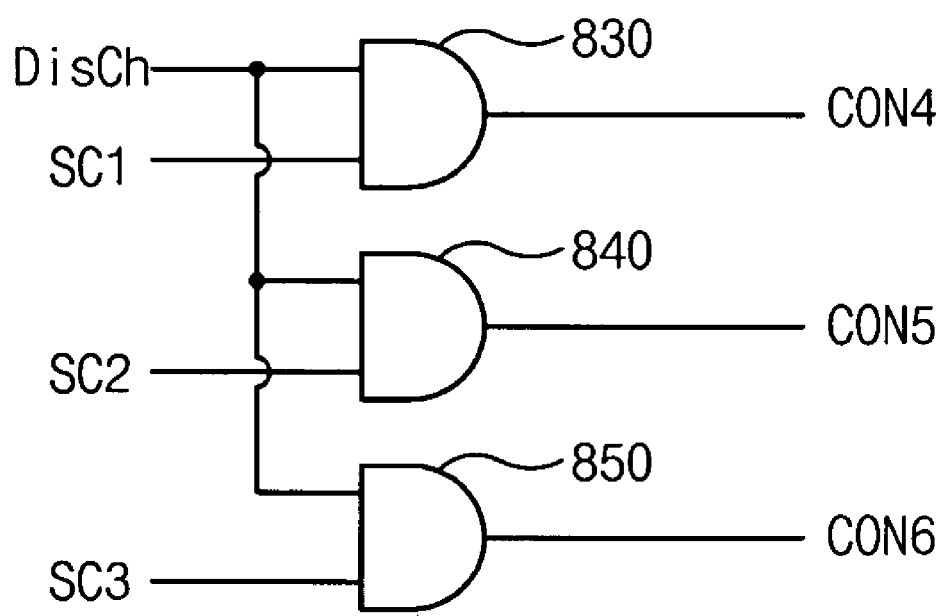

FIG. 13
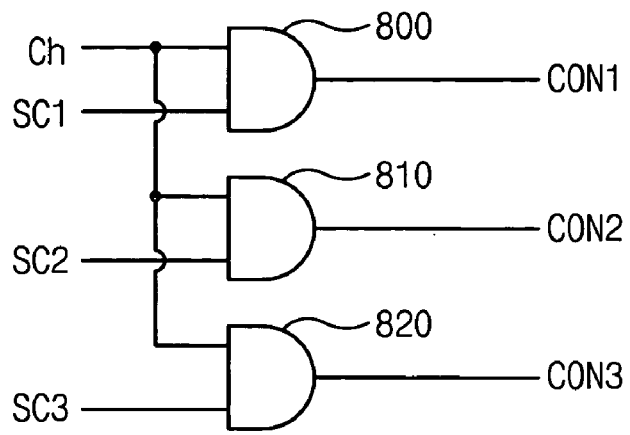
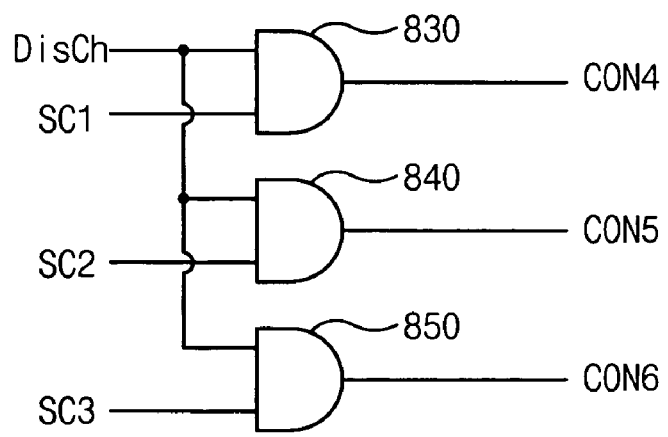
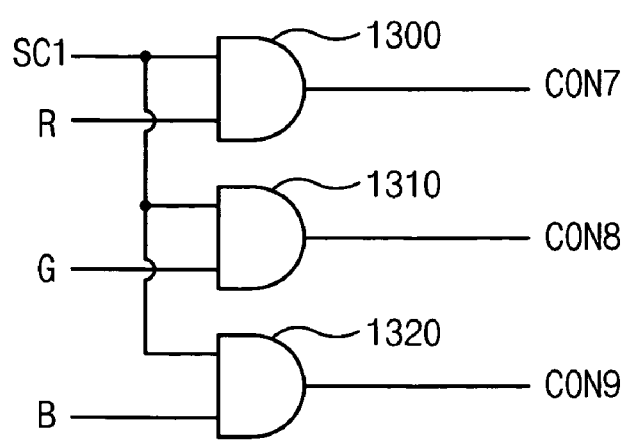

【도 20】

US 7,535,467 B2

ANALOG BUFFER, DISPLAY DEVICE HAVING THE SAME, AND METHOD OF DRIVING THE SAME

CROSS-REFERENCE TO RELATED APPLICATION

This application claims priority to Korean Patent Application No. 2004-33083 filed on May 11, 2004, the contents of which are herein incorporated by reference in its entirety.

TECHNICAL FIELD

The present invention relates to an analog buffer, a display device having the analog buffer, and a method of driving the analog buffer, and more particularly, to an analog buffer for high gray scale and high resolution applications.

DESCRIPTION OF THE RELATED ART

Information processing apparatuses having various functions and shapes are increasingly being developed. These information processing apparatuses typically use a display device such as a liquid crystal display (LCD) to display the information processed therein. An LCD device has many merits, for example, it is lightweight, and thin, has low power consumption and is capable of displaying high resolution images.

The LCD device may be classified as either a poly silicon type or an amorphous silicon type. The poly silicon type LCD device includes thin film transistors (TFTs) including poly silicon (poly-Si), and the amorphous silicon type LCD device includes TFTs including amorphous silicon (a-Si).

The poly silicon type LCD device has low power consumption and a high operating speed in comparison to the amorphous silicon type LCD device. However, the poly silicon type LCD device requires a more complex manufacturing process.

The poly silicon type LCD device is commonly used for small-sized display devices, and the amorphous silicon type LCD device is used for large-sized display devices such as a notebook personal computer (PC), an LCD monitor, a television set, etc.

According to low temperature poly silicon (LTPS) technology, a gate driving section and a data driving section are mounted directly on a display panel. Further, a system for driving the gate and data driving sections may be mounted on the display panel. The system for driving the gate and data driving sections includes an analog circuit such as a digital-analog (D/A) converter, an analog buffer, etc. An example of the analog buffer is a source follower.

FIG. 1 is an equivalent circuit diagram illustrating a conventional source follower, and FIG. 2 is a timing diagram illustrating a control signal for controlling switches in FIG. 1. An input terminal of the source follower is electrically connected to a D/A converter (or DAC) of a data driving section, and an output terminal of the source follower is electrically connected to loads that correspond to source lines (or data lines) of a display panel.

Referring to FIGS. 1 and 2, when a first switch SW1 is turned on, an output voltage Vd of the DAC is applied to a node 'A' and a second switch SW2 is opened, so that a compensation capacitor C1 is electrically charged until a potential difference between the node 'A' and a node 'B' reaches Vth, which corresponds to a threshold voltage of a driver TFT 100.

Then, the first switch SW2 is turned off and the second switch SW2 is turned on to raise a voltage of the node 'B' from Vd−Vth to Vd, so that a voltage of the node 'A' is also raised from Vd to Vd+Vth. A voltage of a node 'C' becomes Vd because a voltage difference between the node 'A' and the node 'C' is the threshold voltage Vth.

As described above, an operation of the source follower involves two steps. First, the source follower stores the threshold voltage Vth through the compensation capacitor C1 by turning on the first switch SW1, and second, the source follower drives loads through the driver TFT 100.

The source follower employs a negative (N)-type TFT during electrical charging, and a positive (P)-type TFT during electrical discharging. Therefore, an absolute value of Vgs (e.g., |Vgs|) of the driver TFT 100 decreases to lower a driving power of the driver TFT 100 as shown in FIG. 3. Additionally, a time for storing the threshold voltage Vth increases for the same reasons described above.

FIG. 3 is a graph illustrating output voltages of the source follower in FIG. 1. Referring to FIG. 3, as the time for a voltage to reach Vd increases, the driving speed of the load is lowered.

The source follower in FIG. 1 takes a long time to perform both the first step of storing the threshold voltage and the second step of driving the loads. Therefore, the source follower in FIG. 1 is typically not used in an LCD device that requires a short time for driving source lines to display moving pictures.

Referring again to FIG. 1, a parasitic capacitance Cgs is generated between a gate terminal of the driver TFT 100 and a source terminal of the driver TFT 100, and a parasitic capacitance Cgd is generated between the gate terminal of the driver TFT 100 and a drain terminal of the driver TFT 100. The parasitic capacitances Cgs and Cgd are in electrical communication with the compensation capacitor C1 to influence a gate voltage of the driver TFT 100.

The following Expression 1 represents the gate voltage of the driver TFT 100 in the second step for driving loads.

Expression 1

$$Vg = V\text{compensation} \times Vth/(V\text{compensation} + V\text{parastic}) + Vd,$$

wherein 'Vcompensation' represents a voltage of the compensation capacitor C1, and 'Vparasitic' represents a voltage of the parasitic capacitances Cgs and Cgd.

Referring to Expression 1, the gate voltage Vd of the driver TFT 100 is influenced by a voltage of the compensation capacitor C1 and a voltage of the parasitic capacitances Cgs and Cgd.

The following Expression 2 represents an error voltage Verror generated by the parasitic capacitances Cgs and Cgd.

Expression 2

$$V\text{error} = V\text{parasitic} \times Vth/(V\text{compensation} + V\text{parasitic}).$$

In order to strengthen a driving power of the source follower, a channel width of the driver TFT 100 is widened. However, when the channel width of the driver TFT 100 increases, the parasitic capacitances Cgs and Cgd also increase thus increasing the error voltage Verror.

On the contrary, when the channel width of the driver TFT 100 decreases, the parasitic capacitances Cgs and Cgd also decrease. However, a time for electrically charging the compensation capacitor C1 increases.

As described above, the source follower requires a long time for driving source lines as one source follower drives one source line to reduce operation time. However, it is difficult to form a poly-Si TFT having a large size and width of one pixel using LTPS because the size of the poly-Si TFT is greater than the width of one pixel.

SUMMARY OF THE INVENTION

The present invention provides an analog buffer capable of stabilizing an output voltage during a process of manufacturing transistors in the analog buffer. The analog buffer is also capable of reducing the size of a source driving circuit. The present invention also provides a display device having the analog buffer and a method of driving the analog buffer.

In an exemplary analog buffer according to the present invention, the analog buffer applies an analog voltage to a load. The analog buffer includes a comparator and a transistor. The comparator is configured to compare an input voltage provided from an external device with an analog voltage applied to the load. The transistor is turned on to electrically charge the load when the analog voltage is lower than the input voltage and turned off when the analog voltage is substantially the same as the input voltage.

In another exemplary analog buffer according to the present invention, the analog buffer applies an analog voltage to a load. The analog buffer includes a comparator and a transistor. The comparator is configured to compare an input voltage provided from an external device with an analog voltage applied to the load. The transistor is turned on to electrically discharge the load when the analog voltage is higher than the input voltage and turned off when the analog voltage is substantially the same as the input voltage.

In still another exemplary analog buffer according to the present invention, the analog buffer applies an analog voltage to a load. The analog buffer includes a comparator, a first transistor and a second transistor. The comparator is configured to compare an input voltage provided from an external device with an analog voltage applied to the load. The first transistor is turned on to electrically charge the load when the analog voltage is lower than the input voltage and turned off when the analog voltage is substantially the same as the input voltage. The second transistor is turned on to electrically discharge the load when the analog voltage is higher than the input voltage and turned off when the analog voltage is substantially the same as the input voltage.

In still another exemplary analog buffer according to the present invention, the analog buffer applies an analog voltage to a load having a reference voltage that is previously set. The analog buffer includes a comparator, a first transistor and a second transistor. The comparator is configured to compare an input voltage provided from an external device with the reference voltage. The first transistor is turned on to apply a voltage, which is higher than the reference voltage by an amplitude of the input voltage, to the load when the input voltage is lower than the reference voltage. The second transistor is turned on to apply a voltage, which is lower than the reference voltage by an amplitude of the input voltage, to the load when the input voltage is higher than the reference voltage.

In an exemplary display device according to the present invention, the display device includes a display panel and a control section. The display panel has a plurality of gate lines and a plurality of data lines that are substantially perpendicular to the gate lines. The display panel displays an image. The control section receives a primitive image signal for displaying the image and a control signal for controlling the display panel. The control section has an analog buffer that receives an input voltage, and generates an analog voltage applied to the data lines of the display panel. The analog buffer includes a comparator, a first transistor and a second transistor. The comparator is configured to compare the input voltage with the analog voltage. The first transistor is turned on to electrically charge the data lines when the analog voltage is lower than the input voltage, and turned off when the analog voltage is substantially the same as the input voltage. The second transistor is turned on to electrically discharge the data lines when the analog voltage is higher than the input voltage, and turned off when the analog voltage is substantially the same as the input voltage.

In another exemplary embodiment of the present invention, a method of driving an analog buffer for applying an analog voltage to a load comprises: comparing an input voltage received from an external device with the analog voltage; electrically charging the load with a first voltage when the analog voltage is lower than the input voltage until the analog voltage is substantially the same as the input voltage; and electrically discharging the load with a second voltage when the analog voltage is higher than the input voltage until the analog voltage is substantially the same as the input voltage. The first voltage is a source voltage and the second voltage is a ground voltage.

BRIEF DESCRIPTION OF THE DRAWINGS

The above and other features of the present invention will become more apparent by describing in detailed exemplary embodiments thereof with reference to the accompanying drawings, in which:

FIG. 9 is a conceptual circuit diagram illustrating a switch control section for generating first to sixth control signals in accordance with the control signal in FIG. 8;

FIG. 13 is a conceptual circuit diagram illustrating a switch control section for generating first to ninth control signals in accordance with the control signal in FIG. 12;

DESCRIPTION OF EXEMPLARY EMBODIMENTS

It should be understood that the exemplary embodiments of the present invention described below may be modified in many different ways without departing from the inventive principles disclosed herein, and the scope of the present invention is therefore not limited to these particular embodiments. Rather, these embodiments are provided so that this disclosure will be thorough and complete, and will fully convey the concept of the invention to those skilled in the art by way of example and not of limitation.

Hereinafter, the exemplary embodiments of the present invention will be described in detail with reference to the accompanying drawings.

Figure 1:
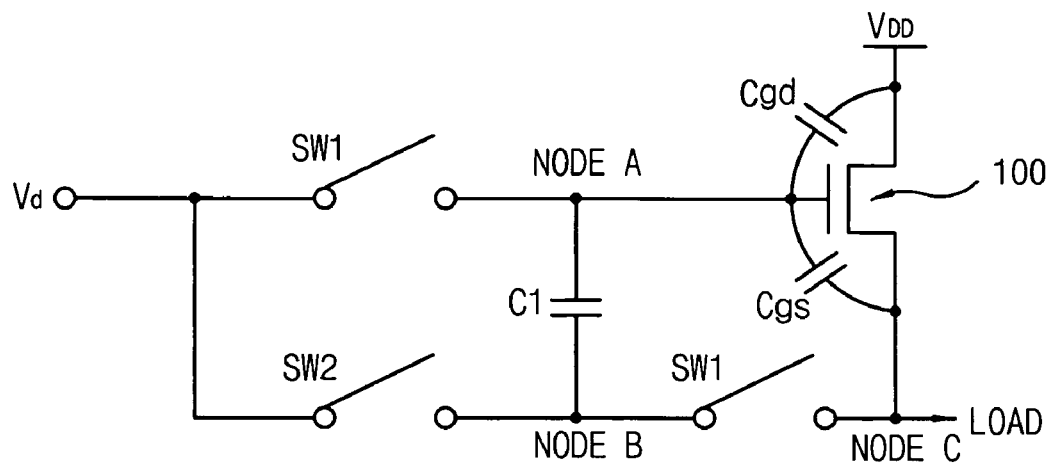
FIG. 1 is an equivalent circuit diagram illustrating a conventional source follower.
Figure 2:
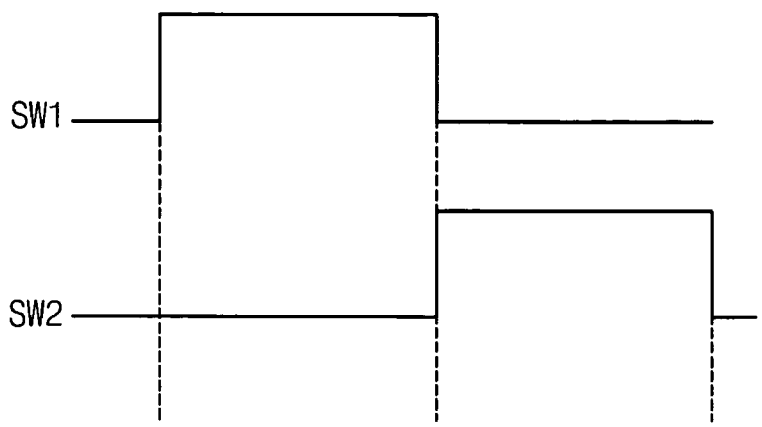
FIG. 2 is a timing diagram illustrating a control signal for controlling switches in FIG. 1.
Figure 3:
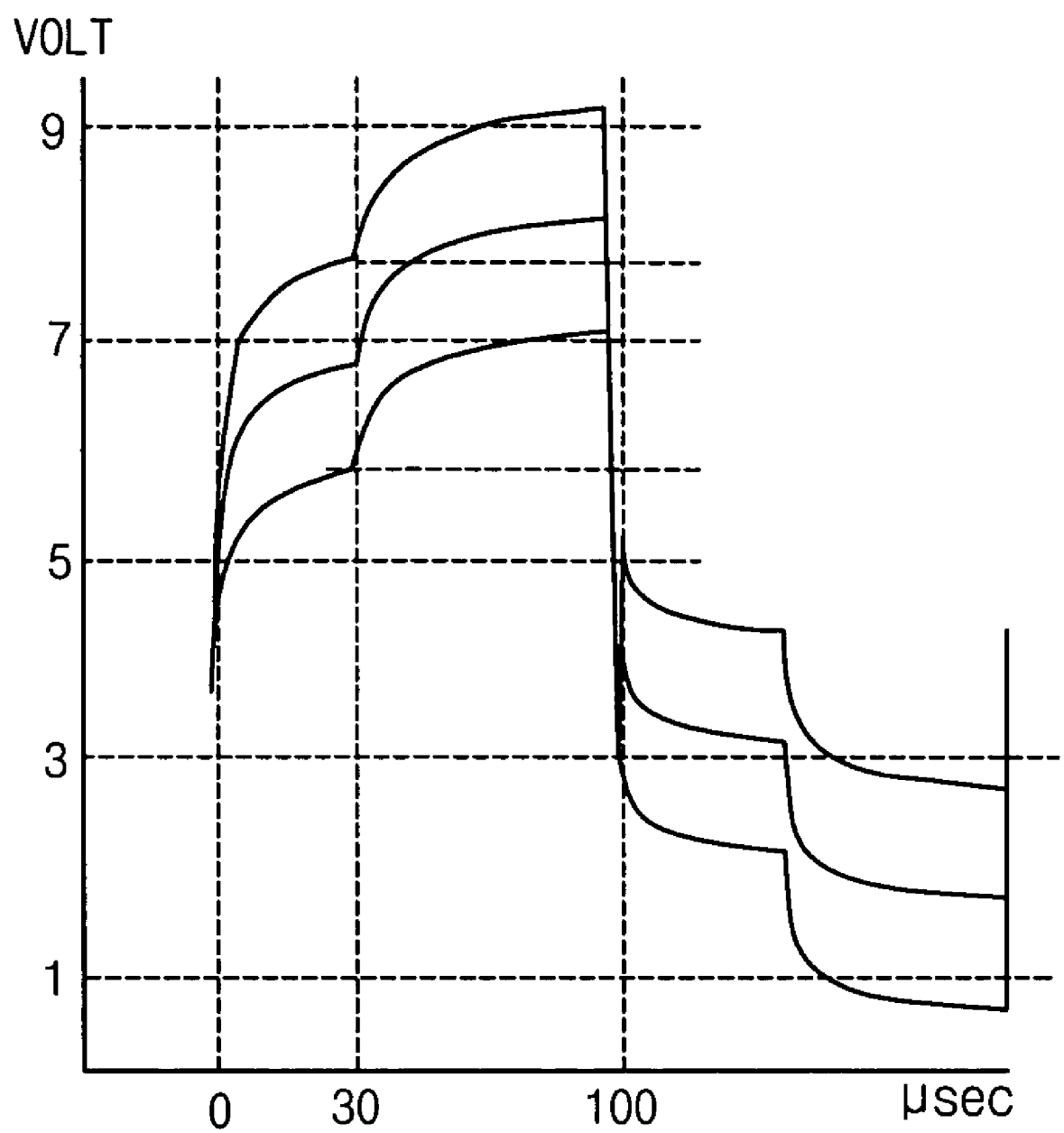
FIG. 3 is a graph illustrating output voltages of the source follower in FIG. 1.
Figure 4:
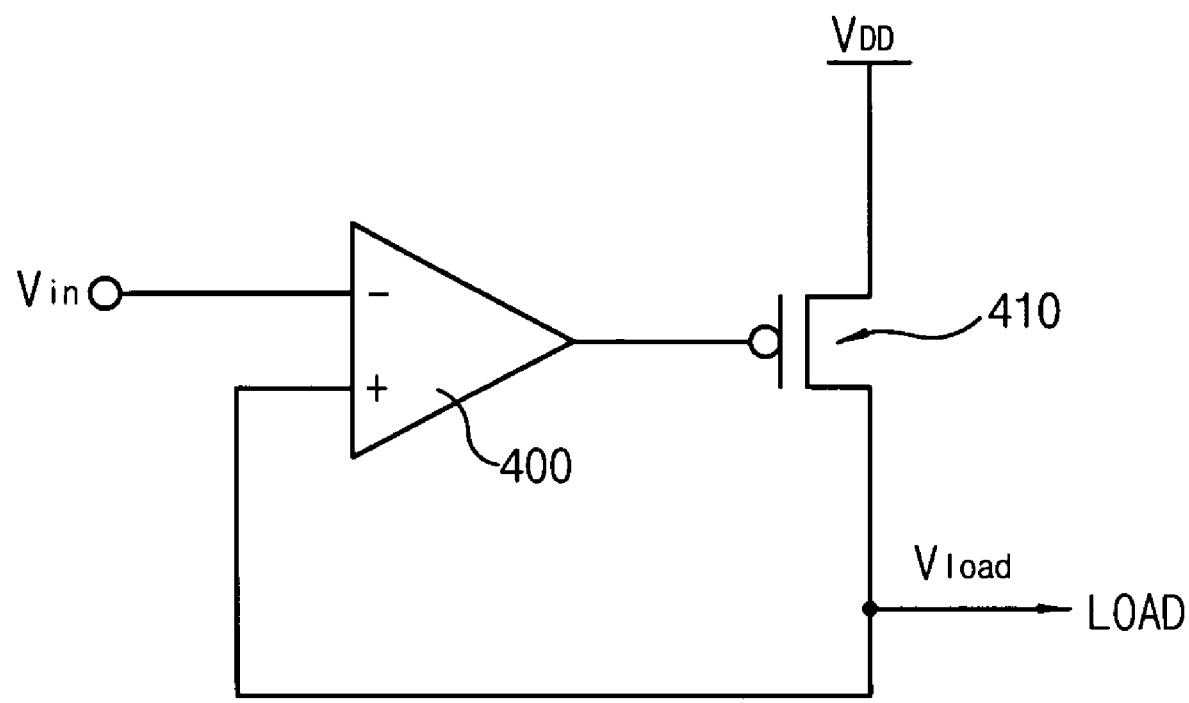
FIG. 4 is a conceptual circuit diagram illustrating an analog buffer according to an exemplary embodiment of the present invention.

FIG. 4 is a conceptual circuit diagram illustrating an analog buffer according to an exemplary embodiment of the present invention. Referring to FIG. 4, an analog buffer includes a comparator 400 and a driver thin-film-transistor (TFT) 410 for driving loads.

The comparator 400 includes a negative terminal, a positive terminal and an output terminal. The driver TFT 410 includes a gate terminal, a drain terminal and a source terminal. An input voltage Vin is applied to the comparator 400 through the negative terminal of the comparator 400. The positive terminal of the comparator 400 is electrically connected to the drain terminal of the driver TFT 410. The output terminal of the comparator 400 is electrically connected to the gate terminal of the driver TFT 410. A load or loads are electrically connected to the drain electrode of the driver TFT 410. A P-type MOS (PMOS) transistor may be, for example, employed as the driver TFT 410.

Hereinafter, an operation of the analog buffer will be explained.

When a voltage applied to the load is 0V and the input voltage Vin is applied to the negative terminal of the comparator 400, the comparator 400 outputs a voltage at a low level to turn on the driver TFT 410. Then, a voltage of the load is boosted.

The positive input terminal of the comparator 400 is electrically connected to the drain electrode of the driver TFT 400, so that when the voltage of the load is boosted to be equal to the input voltage Vin, the comparator 400 outputs a voltage at a high level to turn off the driver TFT 410. Then, a voltage of the load is not boosted to be equal to the input voltage Vin.

As discussed above, the analog buffer electrically charges the load when having a PMOS TFT as the driver TFT 410. However, when the analog buffer is formed, for example, to electrically discharge the load, the analog buffer includes the driver TFT 410 having an NMOS TFT. In detail, the NMOS TFT includes a source terminal electrically connected to a ground voltage, a drain electrode electrically connected to the positive terminal of the comparator 400 and a gate electrode that is electrically connected to the output terminal of the comparator 400.

Figure 5:
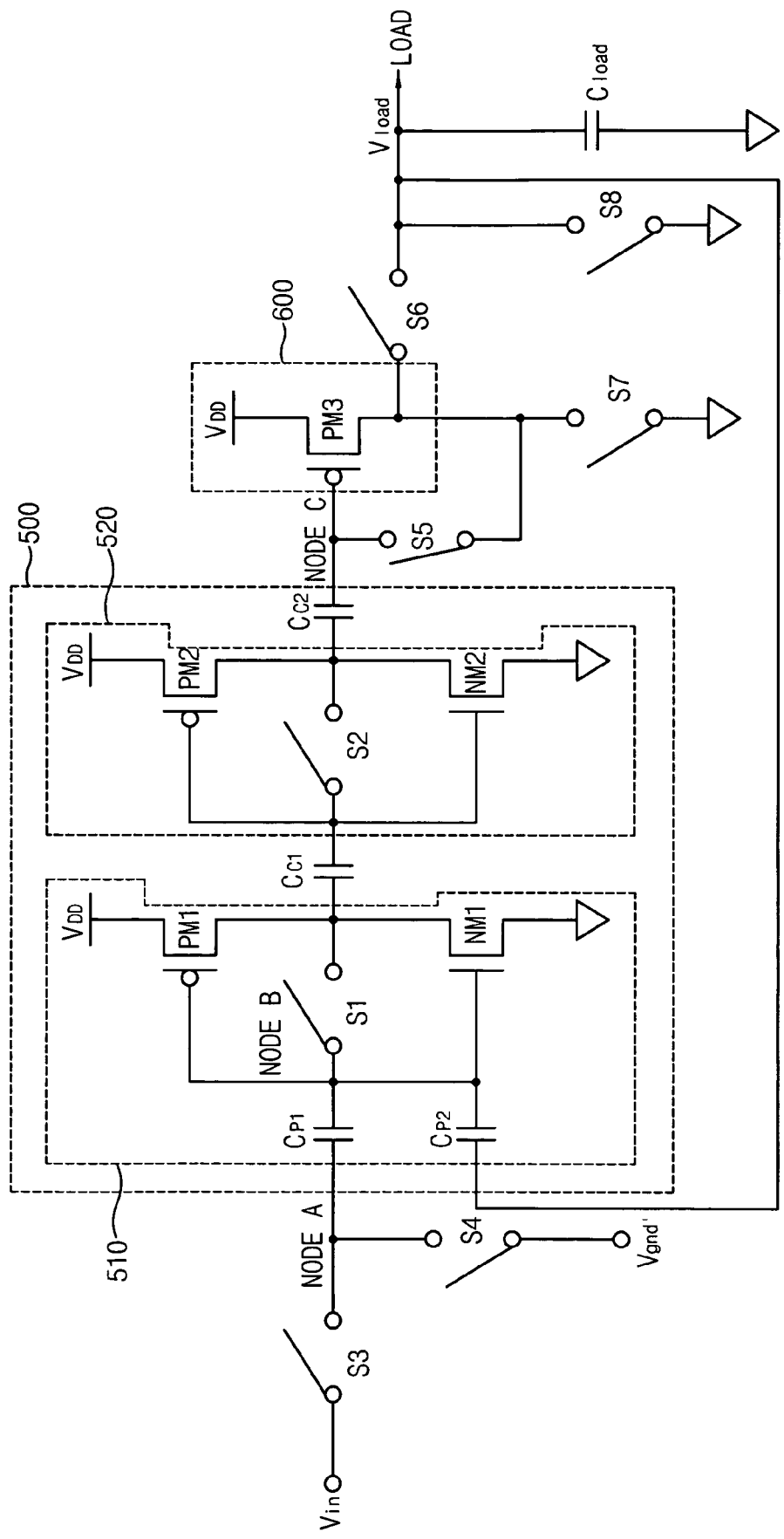
FIG. 5 is a circuit diagram illustrating an example of the analog buffer in FIG. 4.
Figure 6:
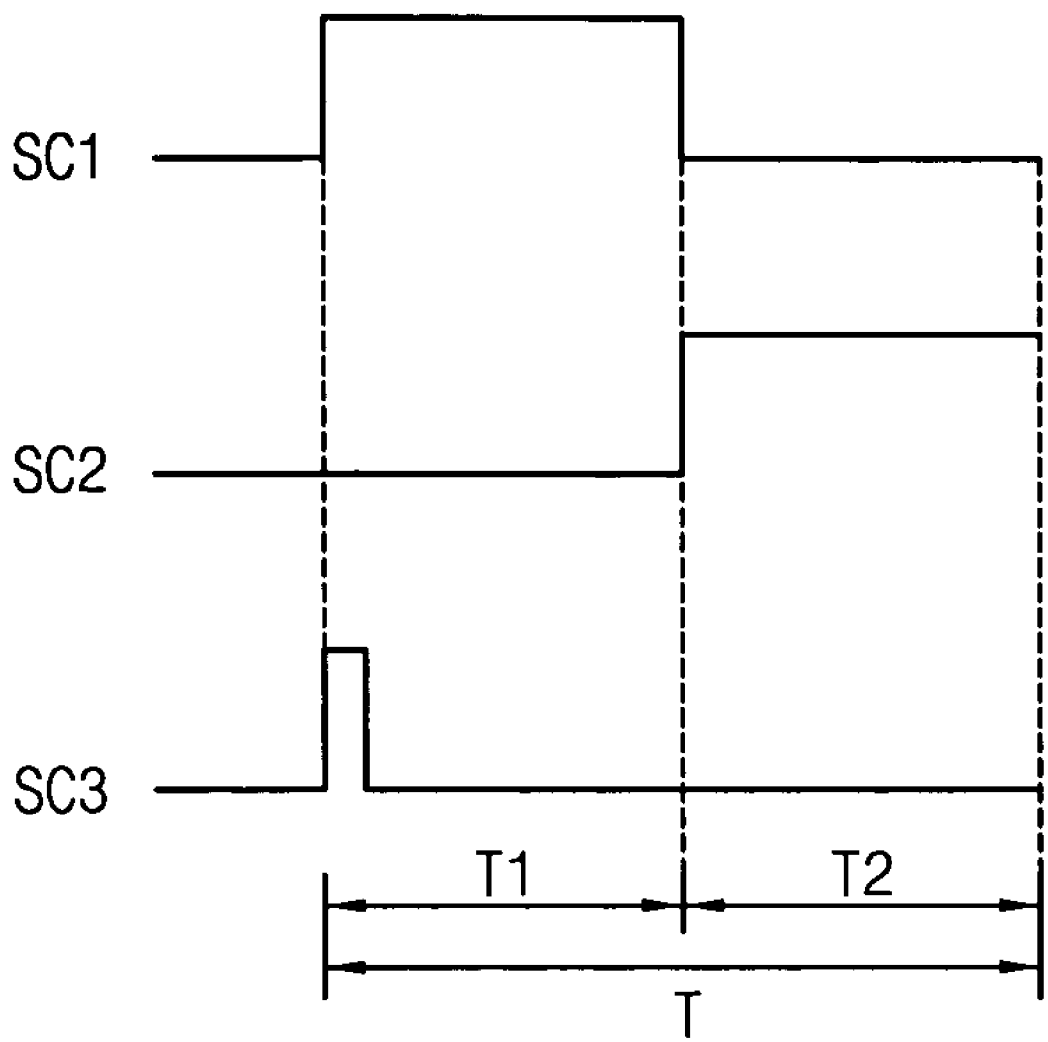
FIG. 6 is a timing diagram illustrating a control signal for controlling the analog buffer in FIG. 5.

FIG. 5 is a circuit diagram illustrating an example of the analog buffer in FIG. 4, and FIG. 6 is a timing diagram illustrating a control signal for controlling the analog buffer in FIG. 5.

Referring to FIG. 5, the analog buffer includes a comparator 500 and a driver TFT 600. The comparator 500 includes a first inverter 510 and a second inverter 520. The first inverter 510 includes a first PMOS transistor PM1 and a first NMOS transistor NM1. A gate terminal of the first PMOS transistor PM1 is electrically connected to a gate terminal of the first NMOS transistor NM1, and a drain terminal of the first PMOS transistor PM1 is electrically connected to a drain terminal of the first NMOS transistor NM1. A source terminal of the first PMOS transistor PM1 is electrically connected to a source voltage Vdd, and a source terminal of the first NMOS transistor NM1 is electrically connected to a ground voltage.

The second inverter 520 includes a second PMOS transistor PM2 and a second NMOS transistor NM2. A gate terminal of the second PMOS transistor PM2 is electrically connected to a gate terminal of the second NMOS transistor NM2, and a drain terminal of the second PMOS transistor PM2 is electrically connected to a drain terminal of the second NMOS transistor NM2. A source terminal of the second PMOS transistor PM2 is electrically connected to the source voltage Vdd, and a source terminal of the second NMOS transistor NM2 is electrically connected to the ground voltage.

The first and second inverters 510 and 520 are electrically connected to each other through a first switch S1 and a second switch S2. In detail, the gate electrodes of the first PMOS transistor PM1 and the first NMOS transistor NM1 are electrically connected to the drain electrodes of the first PMOS transistor PM1 and the first NMOS transistor NM1 through the first switch S1. The gate electrodes of the second PMOS transistor PM2 and the second NMOS transistor NM2 are electrically connected to the drain electrodes of the second PMOS transistor PM2 and the second NMOS transistor NM2 through the second switch S2.

The first and second PMOS transistors PM1 and PM2 and the first and second NMOS transistors NM1 and NM2 of the first and second inverters 510 and 520 operate in a saturation region as a comparator for amplifying the input voltage Vin. A first coupling capacitor Cc1 is located between the first and second inverters 510 and 520, and a second coupling capacitor Cc2 is located between the second inverter 520 and the driver TFT 600.

A first terminal of a first compensation capacitor Cp1 and a first terminal of a second compensation capacitor Cp2 are electrically connected to the drain electrodes of the first PMOS transistor PM1 and first NMOS transistor NM1. A second terminal of the first compensation capacitor Cp1 is electrically connected to the input voltage Vin through a third switch S3, and the second terminal of the first compensation capacitor Cp1 is electrically connected to a ground voltage Vgnd' through a fourth switch S4. A second terminal of the second compensation capacitor Cp2 is electrically connected to the load for transmitting a load voltage Vload back to the first inverter 510.

The driver TFT 600 includes a gate terminal, a source terminal and a drain terminal. The gate terminal of the driver TFT 600 is electrically connected to an output terminal of the second inverter 520 through the second compensation capacitor Cc2. The source terminal of the driver TFT 600 is electrically connected to the source voltage Vdd. The drain terminal of the driver TFT 600 is electrically connected to the gate terminal of the driver TFT 600 through a fifth switch S5, to the load through a sixth switch S6, and to the ground voltage through a seventh switch S7. The load is electrically connected to the ground voltage through an eighth switch S8. A third PMOS transistor PM3 is employed as the driver TFT 600.

The first, second, third, fifth and eighth switches S1, S2, S3, S5 and S8 are turned on by a first switch control signal SC1 in FIG. 6, the fourth and sixth switches S4 and S6 are turned on by a second switch control signal SC2 in FIG. 6, and the seventh switch S7 is turned on by a third switch control signal SC3 in FIG. 6.

Hereinafter, an operation of the analog buffer having the above described structure will be explained.

The first, second, third, fifth and eighth switches S1, S2, S3, S5 and S8 are turned on by the first switch control signal SC1. Additionally, the seventh switch S7 is turned on by the third switch control signal SC3 to initialize the driver TFT 600. The first switch control signal SC1 is high for a first time period T1. During the first time period T1, the input voltage Vin is stored.

When the third switch S3 is turned on, the input voltage Vin is stored in the first compensation capacitor Cp1, and a voltage Vc of a node 'C' is electrically charged to Vdd−Vth through the first and second PMOS transistors PM1 and PM2 and first and second NMOS transistors NM1 and NM2 to turn off the driver TFT 600.

Additionally, the eighth switch S8 is turned on by the first switch control signal SC1 to electrically connect the load to ground. Therefore, the load is electrically discharged to have a voltage of about 0V.

At end of the first time period T1, the second switch control signal SC2 is charged to be high. The second switch control signal SC2 is maintained high for a second time period T2. The fourth and sixth switches S4 and S6 are turned on by the second switch control signal SC2. During the second time period, the load is driven.

When the fourth switch S4 is turned on, a node 'A' of the first compensation capacitor Cp1 for storing the input voltage Vin is electrically connected to the ground voltage Vgnd' so that a voltage of the node 'A' is lowered to about 0V. Therefore, a voltage of the node 'B' is lowered because the node 'B' is electrically coupled with the node 'A' through the first compensation capacitor Cp1. A voltage variation of the node 'B' is amplified by the first and second inverters 510 and 520 to lower the voltage of the node 'C' to about 0V. Therefore, the driver TFT 600 is turned on to increase a voltage of the load Vload.

When the fourth and sixth switches S4 and S6 are turned on by the second switch control signal SC2, the first compensation capacitor Cp1, the second compensation capacitor Cp2 and a load capacitor Cload are electrically coupled. When Va=Vin−Vgnd', where Va represents a variation of a voltage of the node 'A', a voltage variation of the node 'B' Vb is represented by the following Expression 3.

Expression 3

$$Vb = \{[Cp1 \times (Cp2 + Cload)] / [Cp1 \times (Cp2 + Cload) + Cp2 \times Cload]\} \times Va$$
$$= \alpha \times Va.$$

Therefore, α in Expression 3 is represented as follows.

Expression 4

$$\alpha = \{[Cp1 \times (Cp2 + Cload)] / [Cp1 \times (Cp2 + Cload) + Cp2 \times Cload]\}.$$

When a logic threshold voltage of the first inverter 510 is Vlth, a voltage of the node 'B' Vb is represented by the following Expression 4.1.

Expression 4.1

$$Vb = Vlth - \alpha \times Va.$$

When α×Va is higher than Voffset, where Voffset is a minimum voltage of the comparator 500 for driving the driver TFT 600, a voltage variation of the node 'B' (e.g., α×Va) is amplified by the first and second inverters 510 and 520 so that a voltage of the node 'C' Vc is lowered to about 0V. Therefore, the driver TFT 600 is turned on.

When the load voltage Vload increases, the 'B' node voltage Vb increases due to the second compensation capacitor Cp2. In other words, the 'B' node voltage Vb decreases initially due to the first compensation capacitor Cp1 and increases due to the second compensation capacitor Cp2. When the driver TFT 600 is driven, the first and second compensation capacitors Cp1 and Cp2 are electrically connected in series.

A variation of the 'B' node voltage Vb may be expressed by the following Expression 5.

Expression 5

$$Vb = [Cp2/(Cp1+Cp2)] \times Vout = \beta \times Vout,$$

where Vout will be explained below.

In other words, the 'B' node voltage Vb is first decreased by an amount of α×Va through the first compensation capacitor Cp1, and then the 'B' node voltage Vb is increased by an amount of β×Vout through the second compensation capacitor Cp2 as expressed by the following Expression 6.

Expression 6

$$Vb = Vlth - \alpha \times Va + \beta \times Vout.$$

When a decreased amount of the 'B' node voltage Vb equals an increased amount of the 'B' node voltage Vb, the 'B' node voltage Vb is amplified by the first and second inverters 510 and 520 to raise the 'C' node voltage Vc. When the 'C' node voltage Vc is raised to turn off the driver TFT 600, the load voltage Vload is fixed.

When the 'B' node voltage Vb is higher than Vlth+Voffset, the driver TFT 600 is turned off. An off-voltage Vout is represented by the following Expression 7 when the driver TFT 600 is turned off.

Expression 7

$$Vlth + Voffset = Vlth - \alpha \times Va + \beta \times Vout$$

Therefore, the off-voltage Vout of the driver TFT 600 is expressed by the following Expression 8.

Expression 8

$$Vout = (Voffset + \alpha \times Va)/\beta.$$

When Va is equal to Vin−Vgnd', the off-voltage Vout of the Expression 8 may be expressed by the following Expressions 9 through 11.

Expression 9

$$Vout=[Voffset+\alpha\times(Vin-Vgnd')]/\beta.$$

Expression 10

$$Vout=[\alpha\times Vin+(Voffset-\alpha\times Vgnd')]/\beta.$$

Expression 11

$$Vout=(\alpha\times Vin)/\beta+Vdc,$$

where Vdc corresponds to an error voltage generated in the analog buffer, and Vdc equals (Voffset−α×Vgnd')/β. When Vdc is small enough to be negligible, Expression 11 may be expressed by the following Expression 12.

Expression 12

$$Vout\approx(\alpha\times Vin)/\beta=\gamma\times Vin,$$

wherein γ equals to α/β.

When the input voltage Vin is applied to the analog buffer, γ×Vin, which is directly proportional to the input voltage Vin, is applied to the load. For example, when γ is one, the input voltage Vin is directly applied to the load.

When an LCD device employs the above-described analog buffer, an output and an input may be adjusted to be equal by adjusting the output voltage of a DAC to be γ×Vin.

The analog buffer according to the present exemplary embodiment has a 'C' node voltage Vc (e.g., Vdd−Vth) that is applied to the gate electrode of the driver TFT 600. In other words, the driver TFT 600 is driven by the source voltage Vdd, which is higher than the input voltage Vin, so that the load voltage Vload approaches a target level in a short time.

Additionally, the comparator 500 is insensitive to a threshold voltage of the driver TFT 600, which may be changed by variations in a manufacturing process. Further, the driver TFT 600 is electrically charged or electrically discharged according to outputs of the comparator 500. Therefore, an influence of the threshold voltage on the load voltage Vload may be minimized.

As discussed above, the analog buffer only electrically charged the load, and hereinafter, an analog buffer configured to both electrically charge and discharge the load will be explained.

Figure 7:
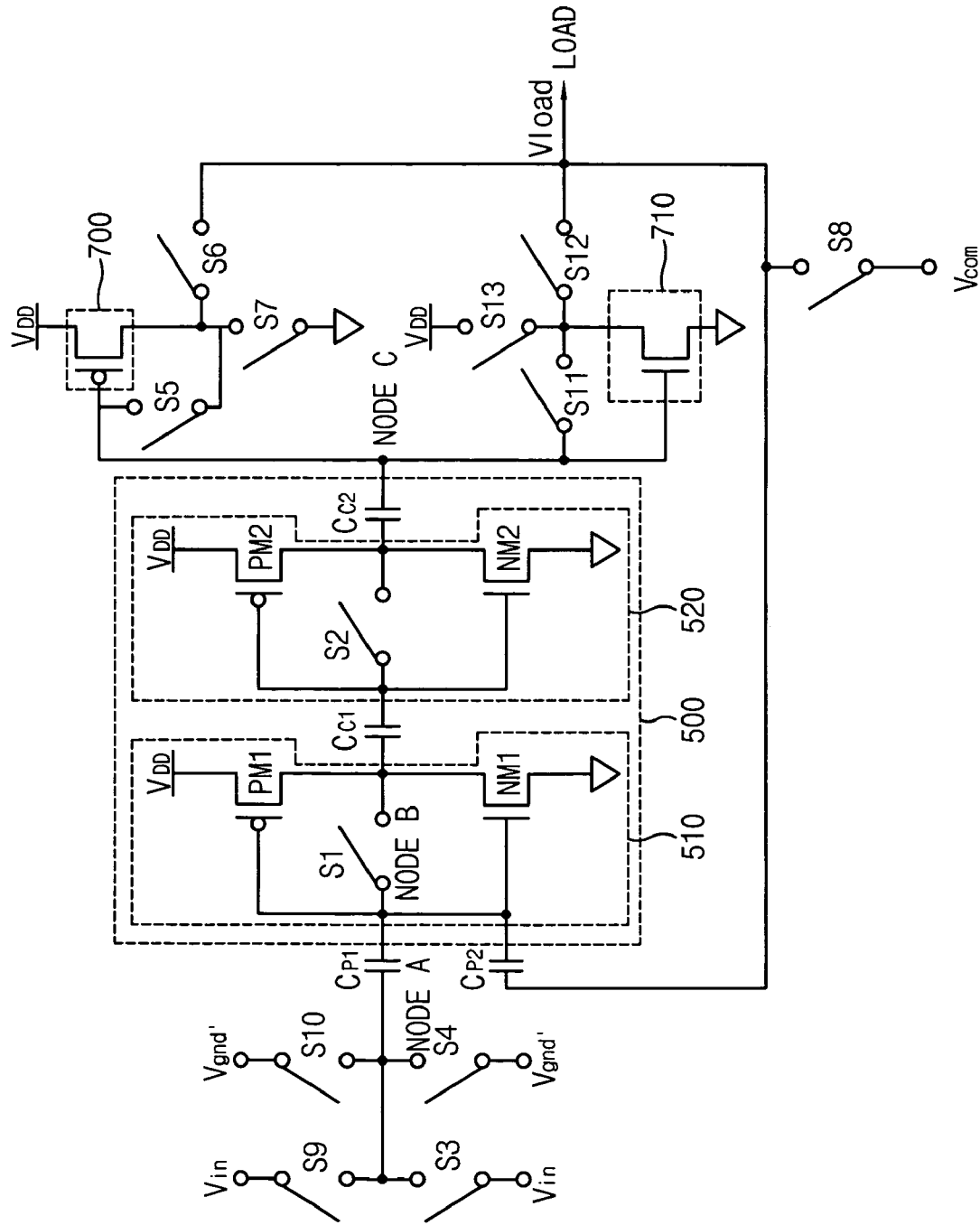
FIG. 7 is a circuit diagram illustrating an analog buffer according to another exemplary embodiment of the present invention.

FIG. 7 is a circuit diagram illustrating an analog buffer according to another exemplary embodiment of the present invention. Referring to FIG. 7, an analog buffer includes a comparator 500, a first driver TFT 700 and a second driver TFT 710. The first driver TFT 700 employs a PMOS transistor, and the second driver TFT 710 employs an NMOS transistor.

The comparator 500 includes a first inverter 510 and a second inverter 520. The first and second inverters 510 and 520 have the same structure as that of the first and second inverters 510 and 520 in FIG. 5. Therefore, any further explanation will be omitted.

As shown in FIG. 7, a first terminal of the first compensation capacitor Cp1 is electrically connected to the gate electrodes of the first PMOS transistor PM1 and the first NMOS transistor NM1 of the first inverter 510. A second terminal of the first compensation capacitor Cp1 is electrically connected to a node 'A'.

When a third switch S3 or a ninth switch S9 is turned on, the input voltage Vin is applied to the node 'A'. When a fourth switch S4 or a ninth switch S9 is turned on, the ground voltage Vgnd' is applied to the node 'A'.

A first terminal of the second compensation capacitor Cp2 is electrically connected to the gate electrodes of the first PMOS transistor PM1 and the first NMOS transistor NM1 of the first inverter 510. A second terminal of the second compensation capacitor Cp2 is electrically connected to the load to transmit the load voltage Vload back to the first inverter 510 so that the load voltage Vload is applied to the first inverter 510.

The first driver TFT 700 includes a gate electrode that is electrically connected to the output terminal of the second inverter 520 through the second coupling capacitor Cc2, a source electrode that is electrically connected to the source voltage Vdd, and a drain electrode that is electrically connected the gate electrode of the first driver TFT 700 through a fifth switch S5. The drain electrode of the first driver TFT 700 is also electrically connected to the load through a sixth switch S6, and to the ground voltage Vgnd' through a seventh switch S7. The load is electrically connected to a common voltage Vcom when an eighth switch S8 is turned on.

The second driver TFT 710 includes a gate electrode that is electrically connected to the output of the second inverter 520 through the second coupling capacitor Cc2, and a drain electrode that is electrically connected to the source voltage Vdd through a thirteenth switch S13. The drain electrode of the second driver TFT 710 is also electrically connected to the gate electrode of the second driver TFT 710 through an eleventh switch S11, and to the load through a twelfth switch S12. A source electrode of the second driver TFT 710 is electrically connected to the ground voltage.

Figure 8:
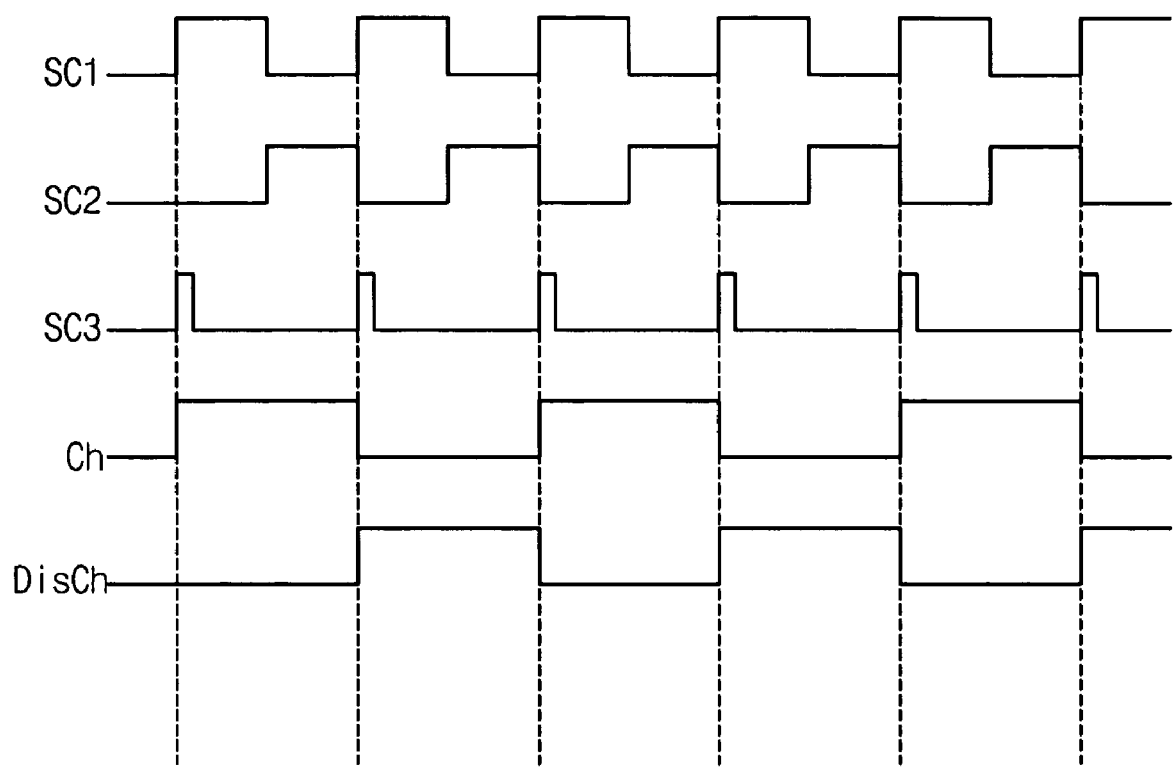
FIG. 8 is a timing diagram illustrating a control signal for controlling the analog buffer in FIG. 7.

FIG. 8 is a timing diagram illustrating a control signal for controlling the analog buffer in FIG. 7, and FIG. 9 is a conceptual circuit diagram illustrating a switch control section for generating first through sixth control signals in accordance with the control signal in FIG. 8. The first through sixth control signals turn on the first through thirteenth switches S1, S2 . . . S13.

Referring to FIGS. 8 and 9, a switch control section includes a first AND-gate 800, a second AND-gate 810, a third AND-gate 820, a fourth AND-gate 830, a fifth AND-gate 840 and a sixth AND-gate 850.

The first AND-gate 800 receives a charging control signal Ch and the first switch control signal SC1 and outputs a first control signal CON1. The second AND-gate 810 receives the charging control signal Ch and the second switch control signal SC2 and outputs a second control signal CON2. The third AND-gate 820 receives the charging control signal Ch and the third switch control signal SC3 and outputs a third control signal CON3. The fourth AND-gate 830 receives a discharging control signal DisCh and the first switch control signal SC1 and outputs a fourth control signal CON4. The fifth AND-gate 840 receives the discharging control signal DisCh and the second switch control signal SC2 and outputs a fifth control signal CON5. The sixth AND-gate 850 receives the discharging control signal DisCh and the third switch control signal SC3 and outputs a sixth control signal CON6.

Referring to FIGS. 7 and 8, the first through thirteenth switches S1, S2 . . . S13 are turned on by the first through sixth control signals CON1 . . . CON6.

In detail, the first switch S1, the second switch S2 and the eighth switch S8 are turned on when the first switch control signal SC1 is high. The third switch S3 and the fifth switch S5 are turned on when the first control signal CON1 is high or both the first switch control signal SC1 and the charging control signal Ch are high. The fourth switch S4 and the sixth switch S6 are turned on when the second control signal CON2 is high or both the second switch control signal SC2 and the charging control signal Ch are high. The seventh switch S7 is turned on when the third control signal CON3 is high or both the third switch control signal SC3 and the charging control signal Ch are high.

The tenth switch S10 and the eleventh switch S11 are turned on when the fourth control signal CON4 is high or both the first switch control signal SC1 and the discharging control signal DisCh are high. The ninth switch S9 and the twelfth switch S12 are turned on when the fifth control signal CON5 is high or both the second switch control signal SC2 and the discharging control signal DisCh are high. The thirteenth switch S13 is turned on when the sixth control signal CON6 is high or both the third switch control signal SC3 and the discharging control signal DisCh are high.

Hereinafter, an operation of the analog buffer having the above-described structure will be explained.

First, an operation for electrically charging the load will be explained.

When the first switch control signal SC1 is high, the first switch S1, the second switch S2 and the eighth switch S8 are turned on. Additionally, the third and the fifth switches S3 and S5 are turned on by the first control signal CON1. The third control signal CON3 turns on the seventh switch S7 to initialize the first driver TFT 700.

When the third switch S3 is turned on, the first compensation capacitor Cp1 is electrically charged by the input voltage Vin, and the first and second inverters 510 and 520 amplify the input voltage Vin so that the 'C' node voltage Vc increases to a value of Vdd−Vth to turn off the first driver TFT 700. Additionally, when the eighth switch S8 is turned on, the load is electrically connected to the common voltage Vcom.

Then, the fourth and sixth switches S4 and S6 are turned on in response to the second control signal CON2. When the fourth switch S4 is turned on, the 'A' node voltage is decreased from Vin to Vgnd'. Therefore, the 'B' node voltage is also decreased due to the first compensation capacitor Cp1. A variation of the 'B' node voltage Vb is amplified by the first and second inverters 510 and 520, so that the 'C' node voltage is lowered to about 0V to turn on the first driver TFT 700. When the first driver TFT 700 is turned on, the load voltage Vload increases.

When the load voltage Vload increases, the 'B' node voltage Vb is also increased due to the second compensation capacitor Cp2. That is, the 'B' node voltage is lowered first due to the first compensation capacitor Cp1, and then raised due to the second compensation capacitor Cp2.

When an amount of the increased 'B' node voltage Vb becomes equal to an amount of the decreased 'B' node voltage Vb, the 'B' node voltage is amplified by the first and second inverters 510 and 520 to raise the 'C' node voltage Vc. Therefore, the first driver TFT 700 is turned off so that the load voltage Vload becomes constant.

Hereinafter, an operation for discharging the load voltage Vload will be explained.

When the first switch control signal SC1 is high, the first, second and eighth switches S1, S2 and S8 are turned on. When the fourth switch control signal SC4 is high, the tenth and eleventh switches S10 and S11 are turned on to initialize the second driver TFT 710.

When the eleventh switch S11 is turned on to electrically connect the 'A' node to the ground voltage Vgnd', the 'A' node voltage Va is lowered to the ground voltage Vgnd' and the 'C' node voltage Vc becomes the threshold voltage Vlth of the second driver TFT 710.

Then, the fifth control signal CON5 turns on the ninth and twelfth switches S9 and S12. When the ninth switch S9 is turned on, the 'A' node voltage is raised from the ground voltage Vgnd' to the input voltage Vin. When the 'A' node voltage Va is raised, the 'B' node voltage Vb is also raised by an amount of α×Vin' as expressed by the following Expression 13.

Expression 13

$$Vb = Vlth + \alpha \times Vin',$$

wherein Vlth represents a logic threshold voltage of the second driver TFT 710, and the Vin' represents Vin−Vgnd'.

As shown in Expression 13, the raised 'B' node voltage Vb is amplified through the first and second inverters 510 and 520 to raise the 'C' node voltage Vc so that the second driver TFT 710 is turned on. When the second driver TFT 710 is turned on, the load is electrically connected to the ground so that the load voltage Vload is lowered.

When an amount of lowered load voltage is represented by Vfall, the 'V' node voltage Vb is lowered by an amount of β×Vfall due to the second compensation capacitor Cp2 as shown by following Expression 14.

Expression 14

$$Vb = Vlth + \alpha \times Vin' - \beta \times Vfall.$$

The second driver TFT 710 is turned off, when the 'B' node voltage Vb is equal to Vlth−Voffset. Therefore, the lowered load voltage Vfall may be expressed as follows.

Expression 15

$$Vlth + \alpha \times Vin' - \beta \times Vfall = Vlth - Voffset,$$

$$Vfall = (\alpha \times Vin' + Voffset)/\beta.$$

At a time when the second driver TFT 710 is turned off, an output voltage Vout of the load is Vcom−Vfall. Therefore, the output voltage Vout may be expressed as follows.

Expression 16

$$Vout = Vcom - (\alpha \times Vin' + Voffset)/\beta,$$

$$= Vcom - (\alpha/\beta) \times Vin + Vdc.$$

When the error voltage Vdc is adjusted to be small by adjusting the ground, voltage Vgnd', Vout in Expression 16 may be expressed as follows.

Expression 17

$$Vout \approx Vcom - (\alpha/\beta) \times Vin = Vcom - \gamma \times Vin$$

As shown in Expression 17, the analog buffer according to the present embodiment may add the input voltage Vin to the common voltage Vcom or subtract the input voltage Vin from the common voltage Vcom. In detail, when the input voltage Vin is higher than the common voltage Vcom, the analog buffer discharges the load. When the input voltage Vin is lower than the common voltage Vcom, the analog buffer charges the load.

In above-explanation, the load is previously charged to be, for example, Vcom. Alternatively, the load may be charged to be the ground voltage (e.g., 0V). Therefore, the analog buffer may add and/or subtract the input voltage Vin to and/or from the ground voltage.

Figure 10:
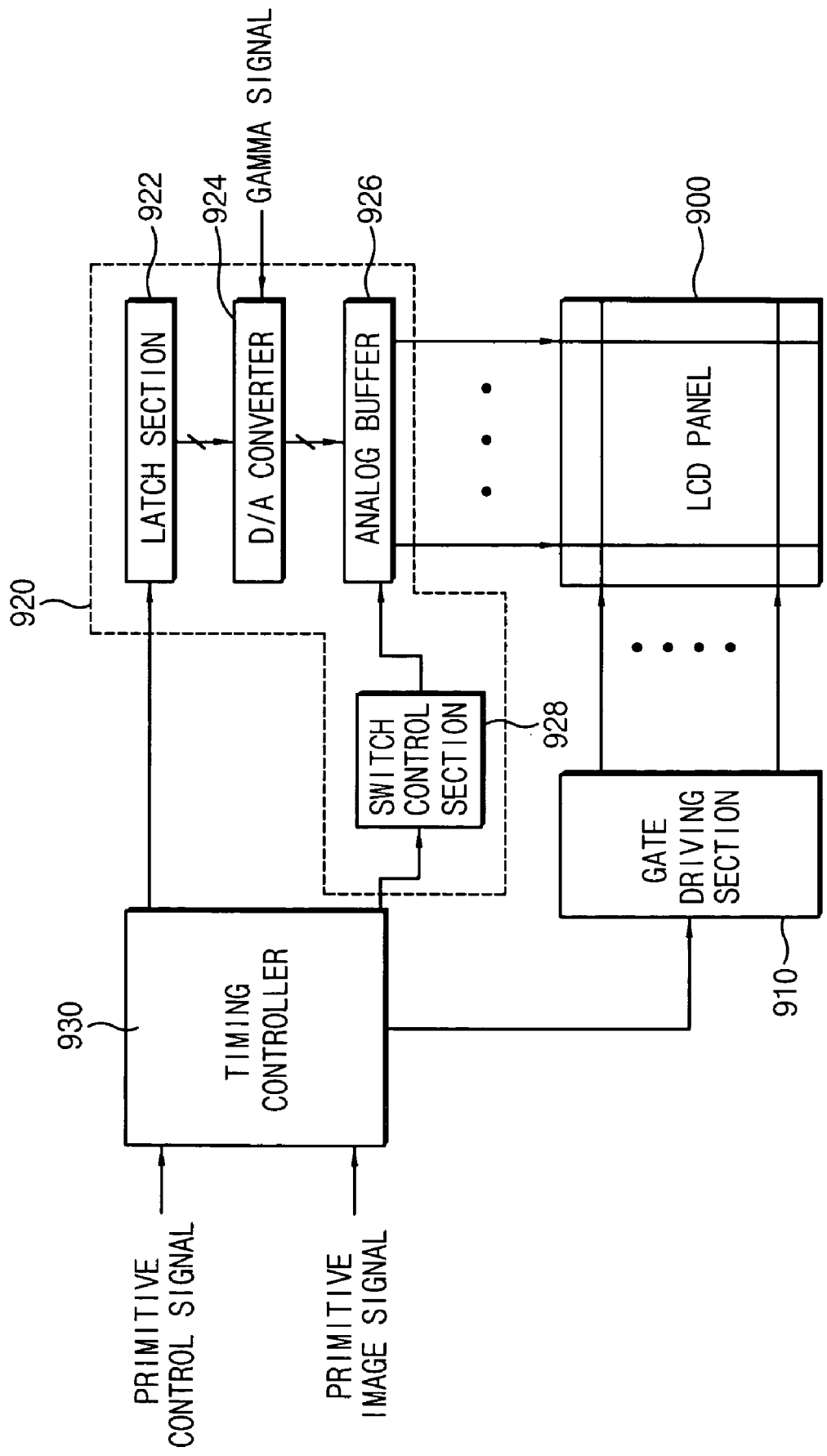
FIG. 10 is a block diagram illustrating a liquid crystal display (LCD) device according to an exemplary embodiment of the present invention.
Figure 11:
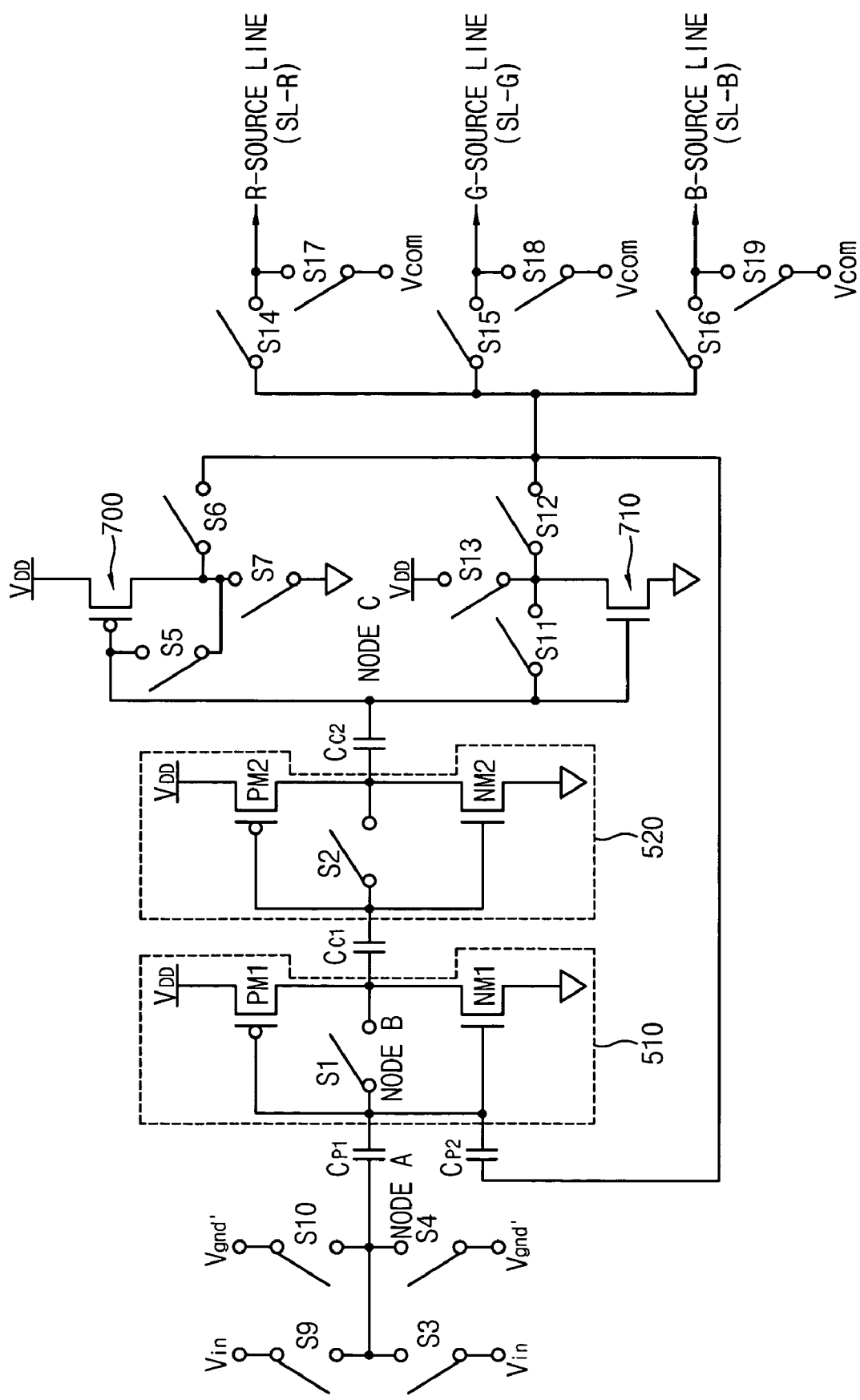
FIG. 11 is a circuit diagram illustrating an analog buffer in FIG. 10.

FIG. 10 is a block diagram illustrating an LCD device according to an exemplary embodiment of the present invention, and FIG. 11 is a circuit diagram illustrating an analog buffer in FIG. 10.

Referring to FIG. 10, an LCD device includes an LCD panel 900, a gate driving section 910, a source driving section 920 and a timing controller 930. The LCD panel 900 displays an image. The gate driving section 910 provides the LCD panel 900 with gate driving signals. The source driving section 920 provides the LCD panel 900 with data signals. The timing controller 930 controls the gate driving section 910 and the source driving section 920 in accordance with a primitive image signal and a primitive control signal provided from an external device.

The source driving section 920 includes a latch section 922, a D/A converter 924, an analog buffer 926 and a switch control section 928. The latch section 922 latches is red, green and blue (RGB) data signals provided from the timing controller 930 to convert a dot-sequence type timing system into a line-sequence type timing system. The D/A converter 924 receives the RGB data signals having the line-sequence type timing system from the latch section 922 to convert the RGB data signals into an analog voltage. The analog buffer 926 receives the analog voltage from the D/A converter 924 and provides the LCD panel 900 with the analog voltage. The switch control section 928 controls the analog buffer 926 in accordance with a control signal provided from the timing controller 930.

Referring to FIG. 11, the analog buffer 926 includes the first inverter 510, the second inverter 520, the first driver TFT 700, the second driver 710, the first compensation capacitor Cp1, the second compensation capacitor Cp2, the first coupling capacitor Cc1 and the second coupling capacitor Cc2.

An R-source line SL-R for driving red (R)-pixels, a G-source line SL-G for driving green (G)-pixels, and a B-source line SL-B for driving blue (B)-pixels are electrically connected to an output terminal of the analog buffer 926. For example, in FIG. 11, three source lines are electrically connected to the output terminal of the analog buffer 926. Alternatively, more than three source lines may be electrically connected to the output terminal of the analog buffer 926.

In detail, the R-source line SL-R is electrically connected to the output terminal of the analog buffer 926 through a fourteenth switch S14, the G-source line SL-G is electrically connected to the output terminal of the analog buffer 926 through a fifteenth switch S15, and the B-source line SL-B is electrically connected to the output terminal of the analog buffer 926 through a sixteenth switch S16.

Additionally, the R-source line SL-R is electrically connected to the common voltage Vcom through a seventeenth switch S17, the G-source line SL-G is electrically connected to the common voltage Vcom through an eighteenth switch S18, and the B-source line SL-B is electrically connected to the common voltage Vcom through a nineteenth switch S19.

Figure 12:
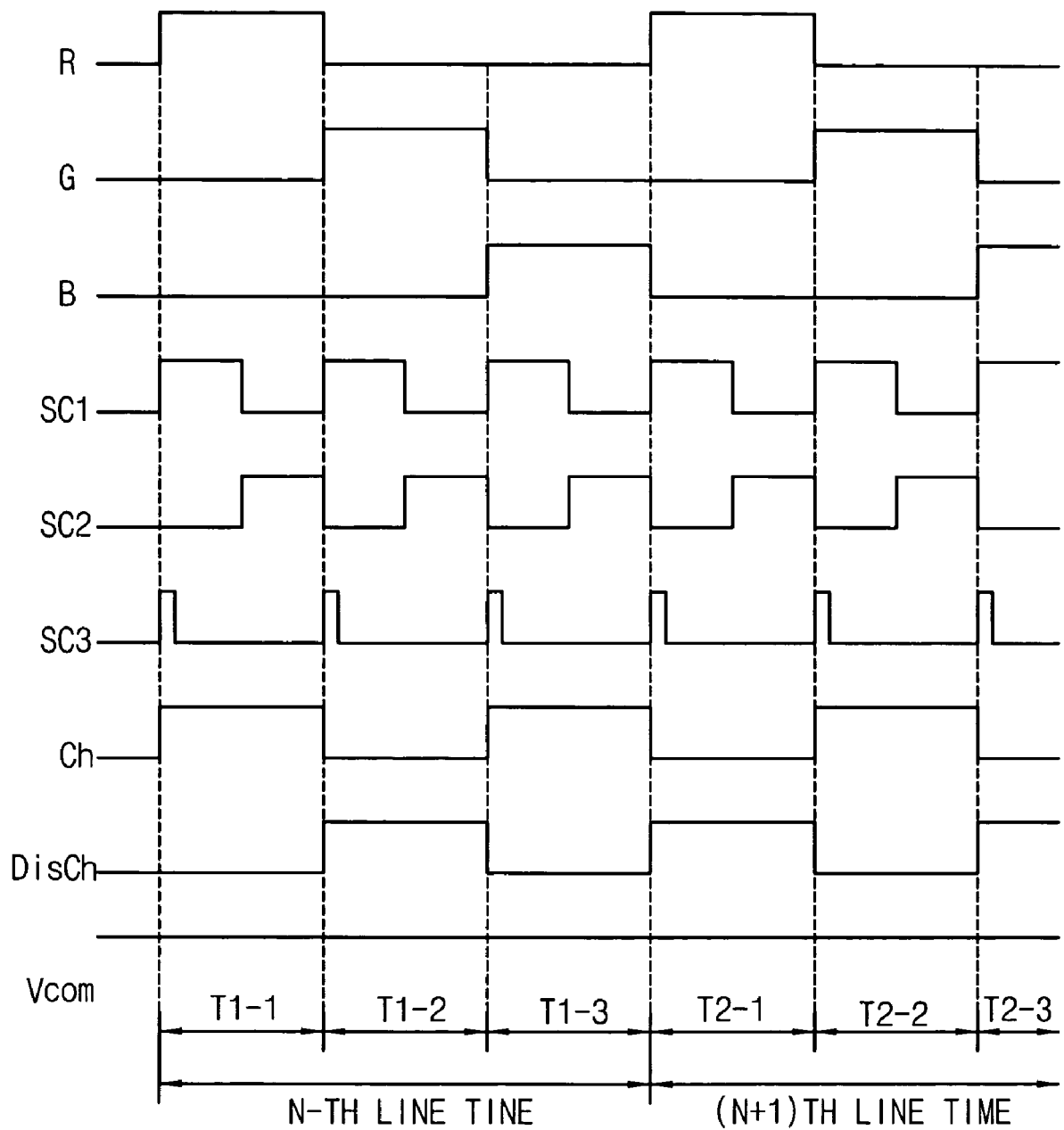
FIG. 12 is a timing diagram illustrating a control signal for a dot inversion of the analog buffer in FIG. 10.

FIG. 12 is a timing diagram illustrating a control signal for a dot inversion of the analog buffer 926, and FIG. 13 is a conceptual circuit diagram illustrating the switch control section 928 for generating first through ninth control signals in accordance with the control signal in FIG. 12. The first through ninth control signals turn on one of the first through nineteenth switches S1, S2 . . . S19.

Referring to FIGS. 12 and 13, the switch control section 928 includes a first AND-gate 800, a second AND-gate 810, a third AND-gate 820, a fourth AND-gate 830, a fifth AND-gate 840, a sixth AND-gate 850, a seventh AND-gate 860, an eighth AND-gate 870 and a ninth AND-gate 880. The first, second, third, fourth, fifth and sixth AND-gates 800, 810, 820, 830, 840 and 850 are same as those in FIG. 9. Thus, any further explanation will be omitted.

The seventh AND-gate 860 receives the first switch control signal SC1 and an R-control signal 'R' and outputs a seventh control signal CON7. The eighth AND-gate 870 receives the first switch control signal SC1 and a G-control signal 'G' and outputs an eighth control signal CON8. The ninth AND-gate 880 receives the first switch control signal SC1 and a B-control signal 'B' and outputs a ninth control signal CON9.

Referring again to FIG. 11, the first through nineteenth switches S1, S2 . . . S19 are turned on by one of the first through ninth control signals CON 1, CON2 . . . CON9.

The first through thirteenth switches S1, S2 . . . S13 are turned on by one of the first through sixth control signals CON1, CON2 . . . CON6 as described above referring to FIG. 7. Thus, any further explanation will be omitted.

The fourteenth switch S14 is turned on in response to the R-control signal 'R', the fifteenth switch S15 is turned on in response to the G-control signal 'G', and the sixteenth switch S16 is turned on in response to the B-control signal 'B'.

The seventeenth switch S17 is turned on when the seventh control signal CON7 is high or both the R-control signal and the first switch control signal SC1 are high. The eighteenth switch S18 is turned on when the eighth control signal CON8 is high or both the G-control signal and the first switch control signal SC1 are high. The nineteenth switch S19 is turned on when the ninth control signal CON9 is high or both the B-control signal and the first switch control signal SC1 are high.

The first and second inverters 510 and 520, the first and second driver TFTs 700 and 710, the first and second compensation capacitors Cp1 and Cp2, and the first and second coupling capacitors Cc1 and Cc2 are same as those in FIG. 7. Thus, any further explanation will be omitted.

Control signals for controlling the first through nineteenth switches S1, S2 . . . S19 are provided from the timing controller 930 in FIG. 9. Alternatively, the control signals for controlling the first through nineteenth switches S1, S2 . . . S19 may be provided from an external device.

Hereinafter, an operation of the LCD device having the above-described structure will be explained.

First, a dot inversion operation of the LCD device will be explained.

Referring again to FIGS. 12 and 13, an N-th line time, when an N-th gate line is driven, is divided into three time intervals of a first time period T1-1, a second time period T1-2 and a third time period T1-3. During the first time period T1-1 of the N-th line time, the R-control signal 'R' and the charging control signal Ch are in a high state, so that the first driver TFT 700 is turned on by the first control signal CON1. Therefore, the analog data voltage (or input voltage) Vin provided from the D/A converter 924 in FIG. 10 is applied to the R-source line SL-R.

During the second time period T1-2 of the N-th line time, the G-control signal 'G' and the discharging control signal DisCh are in a high state, so that the second driver TFT 710 is turned on by the fourth control signal CON4 to discharge the G-source line SL-G.

During the third time period T1-3 of the N-th line time, the B-control signal 'B' and the charging control signal Ch are in a high state, so that the first driver TFT 700 is turned on by the first control signal CON1. Therefore, the analog data voltage Vin is applied to the B-source line SL-B.

An (N+1)-th line time, when an (N+1)-th gate line is driven, is divided into three time intervals of a first time period T2-1, a second time period T2-2 and a third time period T2-3. During the first time period T2-1 of the (N+1)-th line time, the R-control signal 'R' and the discharging control signal DisCh are in a high state, so that the second driver TFT 710 is turned on to discharge the R-source line SL-R.

During the second time period T2-2 of the (N+1)-th line time, the G-control signal 'G' and the charging control signal Ch are in a high state, so that the first driver TFT 700 is turned on. Therefore, the analog data voltage Vin is applied to discharge the G-source line SL-G that was discharged during the second time period T1-2 of the N-th line time.

During the third time period T2-3 of the (N+1)-th line time, the B-control signal 'B' and the discharging control signal DisCh are in a high state, so that the second driver TFT 710 is turned on to discharge the B-source line SL-B.

Therefore, the analog data voltage Vin is applied to each dot (or pixel) such that the analog data voltage Vin of one dot is opposite to the analog data voltage Vin applied to a neighboring dot along longitudinal and latitudinal directions.

Figure 14:
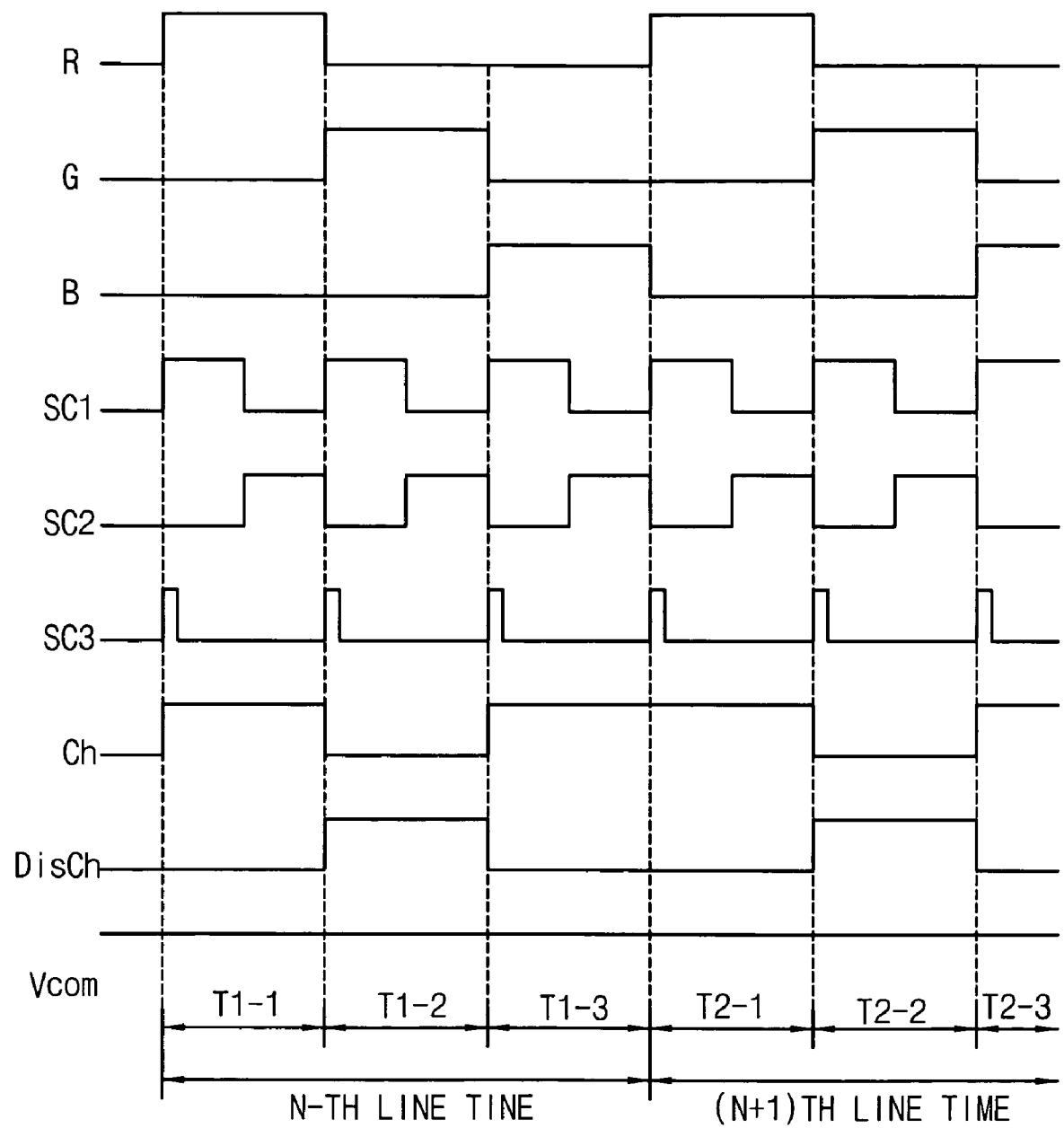
FIG. 14 is a timing diagram illustrating a control signal for a column inversion of the analog buffer in FIG. 11.

FIG. 14 is a timing diagram illustrating a control signal for a column inversion of the analog buffer in FIG. 11.

Referring to FIG. 14, an N-th line time, when N-th gate line is driven, is divided into three time intervals of a first time period T1-1, a second time period T1-2 and a third time period T1-3. During the first time period T1-1 of the N-th line time, the R-control signal 'R' and the charging control signal Ch are in a high state, so that the first driver TFT 700 is turned on by the first control signal CON1. Therefore, the analog data voltage (or input voltage) Vin provided from the D/A converter 924 in FIG. 10 is applied to the R-source line SL-R.

During the second time period T1-2 of the N-th line time, the G-control signal 'G' and the discharging control signal DisCh are in a high state, so that the second driver TFT 710 is turned on by the fourth control signal CON4 to discharge the G-source line SL-G.

During the third time period T1-3 of the N-th line time, the B-control signal 'B' and the charging control signal Ch are in a high state, so that the first driver TFT 700 is turned on by the first control signal CON1. Therefore, the analog data voltage Vin is applied to the B-source line SL-B.

An (N+1)-th line time, when an (N+1)-th gate line is driven, is divided into three time intervals of a first time period T2-1, a second time period T2-2 and a third time period T2-3. During the first time period T2-1 of the (N+1)-th line time, the R-control signal 'R' and the charging control signal Ch are in a high state, so that the first driver TFT 700 is turned on. Therefore, the analog data voltage Vin is applied to the R-source line SL-R.

During the second time period T2-2 of the (N+1)-th line time, the G-control signal 'G' and the discharging control signal DisCh are in a high state, so that the second driver TFT 710 is turned on to discharge the G-source line SL-G.

Therefore, the analog data voltage Vin is applied to each column (or pixels arranged along a column line) such that the analog data voltage Vin of a column is opposite to the analog data voltage Vin applied to a neighboring column along a row direction.

Figure 15:
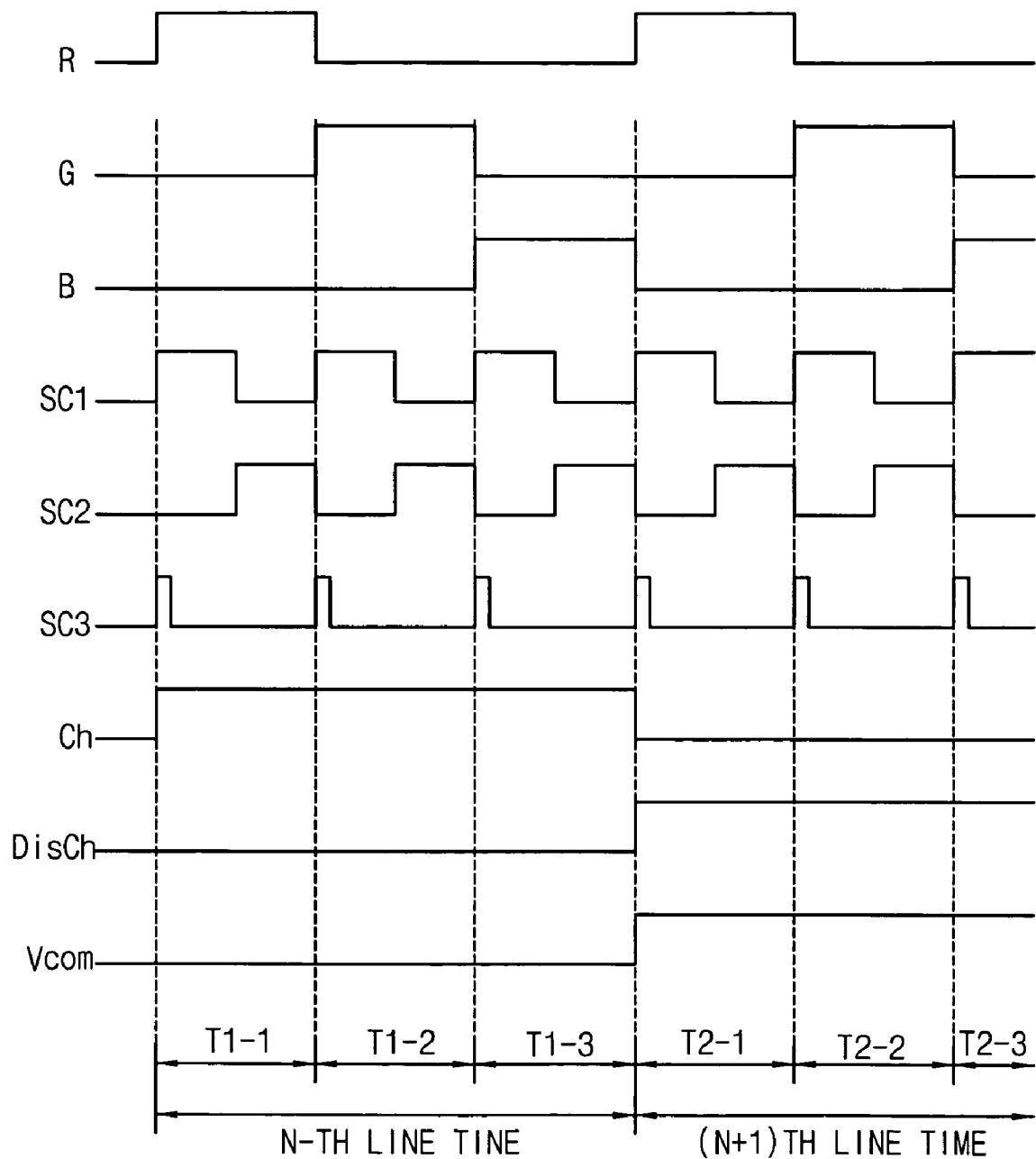
FIG. 15 is a timing diagram illustrating a control signal for a line inversion of the analog buffer in FIG. 11.

FIG. 15 is a timing diagram illustrating a control signal for a line inversion of the analog buffer in FIG. 11.

Referring to FIG. 15, an N-th line time, when the N-th gate line is driven, is divided into three time intervals of a first time period T1-1, a second time period T1-2 and a third time period T1-3. An (N+1)-th line time, when the (N+1)-th gate line is driven, is divided into three time intervals of a first time period T2-1, a second time period T2-2 and a third time period T2-3. During the N-th line time, the common voltage Vcom is low (Vcom-L), and during the (N+1)-th line time, the common voltage Vcom is high (Vcom-H).

During the first time period T1-1 of the N-th line time, the R-control signal 'R' and the charging control signal Ch are in a high state. When the first switch control signal SC1 is high, the seventeenth switch S17 is turned on to electrically connect the R-source line to the common voltage Vcom of a low level (Vcom-L). Therefore, the R-source line is electrically discharged. When the second switch control signal SC2 is high, the first driver TFT 700 is turned on, so that the analog data voltage Vin provided from the D/A converter 924 in FIG. 10 is applied to the R-source line SL-R that is discharged at a previous step.

During the second time period T1-2 of the N-th line time, the G-source line SL-G is discharged to be equal to the common voltage Vcom of a low level (Vcom-L), and then the first driver TFT 700 is turned on so that the analog data voltage Vin is applied to the G-source line SL-G.

During the third time period T1-3 of the N-th line time, the B-source line SL-B is discharged to be equal to the common voltage Vcom of a low level (Vcom-L), and then the first driver TFT 700 is turned on so that the analog data voltage Vin is applied to the B-source line SL-B.

During the first time period T2-1 of the (N+1)-th line time, the R-control signal 'R' and the discharging control signal DisCh are in a high state. When the first switch control signal SC1 is high, the R-th data line DL-R is electrically charged by the common voltage Vcom of a high level (Vcom-H), and when the second switch control signal SC2 is high, the second driver TFT 710 is turned on to electrically discharge the R-source line SL-R, so that the voltage of the R-source line SL-R is lowered from the common voltage Vcom of a high level (Vcom-H) to the analog data voltage Vin.

During the second time period T2-2 of the (N+1)-th line time, the G-source line SL-G is electrically charged by the common voltage Vcom of a high level (Vcom-H) and then the G-source line SL-G is electrically discharged by the analog data voltage Vin. During the third time period T2-3 of the (N+1)-th line time, the B-source line SL-B is electrically charged by the common voltage Vcom of a high level (Vcom-H) and then the B-source line SL-B is electrically discharged by the analog data voltage Vin. According to the present embodiment, the analog buffer is electrically discharged and charged as described above, so that opposite analog data voltages are applied to source lines neighboring each other. Therefore, the line inversion is performed.

Figure 16:
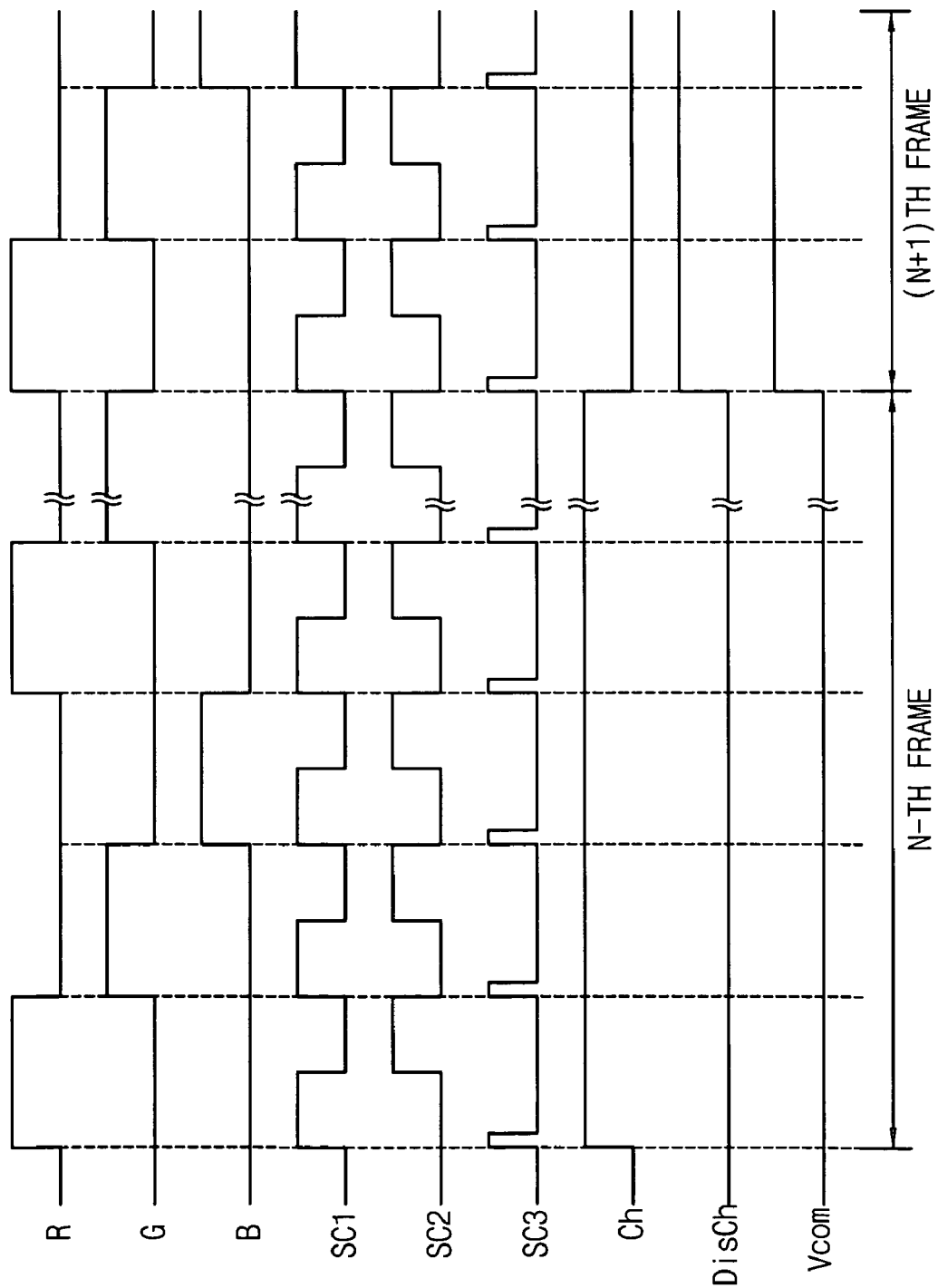
FIG. 16 is a timing diagram illustrating a control signal for a frame inversion of the analog buffer in FIG. 11.

FIG. 16 is a timing diagram illustrating a control signal for a frame inversion of the analog buffer in FIG. 11.

Referring to FIG. 16, the common voltage Vcom is in a low level (Vcom-L) during the N-th frame and the common voltage Vcom is in a high level (Vcom-H) during the (N+1)-th level. The charging control signal Ch is in a high level during the N-th frame and the discharging control signal DisCh is in a high level during the (N+1)-th frame.

Therefore, the first driver TFT 700 is turned on during the N-th frame to sequentially apply analog data voltage Vin to the R-source line SL-R, the G-source line SL-G and the B-source line SL-B, and then, the second driver TFT 710 is turned on during the (N+1)-th frame to electrically discharge the R-source line SL-R, the G-source line SL-G and the B-source line SL-B.

According to the present embodiment, the analog buffer 926 is electrically charged and discharged as described above so that opposite analog data voltages are applied according to frames. Therefore, the frame inversion is performed.

When the source driving section 920 does not modulate the common voltage Vcom and the LCD device does not adopt a multiplexing structure, each source line uses two resistor lines and two decoders to generate a high voltage level and low voltage level.

When the source driving section 920 modulates the common voltage Vcom, each source line uses one decoder, but each source line uses two resistor lines for gamma correction.

However, according to an exemplary embodiment of the present invention, the loads are electrically charged by common voltage Vcom previously and the analog input voltage Vin is applied to the first compensation capacitor Cp1 and then the first compensation capacitor Cp1 is electrically discharged to about 0V. Then the analog buffer 926 performs discharging until the first compensation capacitor Cp1 is compensated such that the load voltage Vload becomes Vcom−Vin. Therefore, the analog buffer 926 outputs a voltage that is lower than the common voltage Vcom.

According to the present embodiment, the analog buffer 926 electrically charges the first compensation capacitor Cp1 by the common voltage Vcom and then outputs a high level voltage and a low level voltage. Therefore, a number of D/A converters and resistor lines may be reduced to be half that of a conventional device having no common voltage Vcom inversion.

Figure 17:
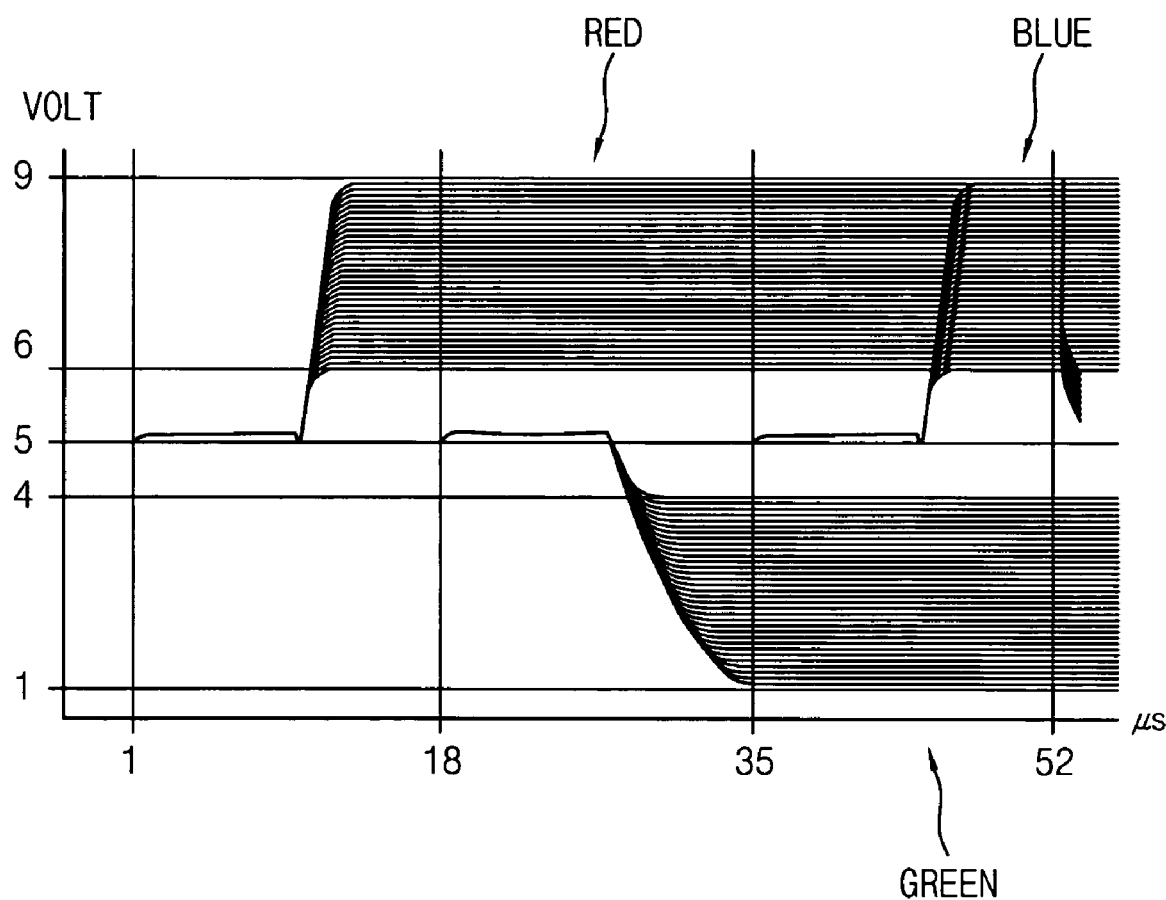
FIG. 17 is a graph illustrating outputs of the analog buffer in FIG. 11, which operates a dot inversion under a condition of Table 1.

FIG. 17 is a graph illustrating outputs of the analog buffer 926 in FIG. 11, which carry out a dot inversion under a condition of Table 1.

Referring to FIG. 17, when the analog buffer 926 performs a dot inversion under the conditions of Table 1, a speed variation of an output voltage does not decrease, even when the output voltage approaches about 9V or about 1V, which corresponds to an objective voltage. Therefore, a driving speed of the load increases such that the RGB source lines may be driven within about 51 μs, which correspond to a gate line time when one gate line is driven.

The LCD panel 900 having, for example, a quarter video graphics array (QVGA) resolution employs the analog buffer 926, and the line time during which one gate line is driven is about 51 μs. The R-source line SL-R, the G-source line SL-G and the B-source line SL-B are driven within about 51 μs. Therefore, the analog buffer 926 has an operation time of about 17 μs.

TABLE 1

| Applied voltage | 13 V |
| --- | --- |
| Analog buffer operation time | 17 μV |
| Load profile | 18 pF, 4k T3 model |
| Input voltage (Vin) range | 1 V~4 V |
| Common voltage | 5 V |
| Output voltage range (Vcom-H) | 1 V~4 V |
| Output voltage range (Vcom-L) | 6 V~9 V |
| Inversion type | Dot inversion |
| Vgnd', Vcom' | 0 V, 5 V |

TABLE 2

| | TFT | | | |
| --- | --- | --- | --- | --- |
| Experiment | PM1, M1 | PM2, NM2 | DPM1 | DNM1 |
| Experiment 1 | Vth + 1 V | Vth + 1 V | Vth + 1 V | No change |
| Experiment 2 | Vth + 1 V | Vth + 1 V | Vth − 1 V | No change |
| Experiment 3 | Vth − 1 V | Vth − 1 V | Vth + 1 V | No change |
| Experiment 4 | Vth − 1 V | Vth − 1 V | Vth − 1 V | No change |
| Experiment 5 | Vth + 1 V | Vth − 1 V | Vth + 1 V | No change |
| Experiment 6 | Vth + 1 V | Vth − 1 V | Vth − 1 V | No change |
| Experiment 7 | Vth − 1 V | Vth + 1 V | Vth + 1 V | No change |
| Experiment 8 | Vth − 1 V | Vth + 1 V | Vth − 1 V | No change |

TABLE 3

| | TFT | | | |
| --- | --- | --- | --- | --- |
| Experiment | PM1, NM1 | PM2, NM2 | DPM1 | DNM1 |
| Experiment 9 | Vth + 1 V | Vth + 1 V | No change | Vth + 1 V |
| Experiment 10 | Vth + 1 V | Vth + 1 V | No change | Vth − 1 V |
| Experiment 11 | Vth − 1 V | Vth − 1 V | No change | Vth + 1 V |
| Experiment 12 | Vth − 1 V | Vth − 1 V | No change | Vth − 1 V |
| Experiment 13 | Vth + 1 V | Vth − 1 V | No change | Vth + 1 V |
| Experiment 14 | Vth + 1 V | Vth − 1 V | No change | Vth − 1 V |
| Experiment 15 | Vth − 1 V | Vth + 1 V | No change | Vth + 1 V |
| Experiment 16 | Vth − 1 V | Vth + 1 V | No change | Vth − 1 V |

Tables 2 and 3 show a condition when a threshold voltage is applied to a gate terminal of one of the driver TFTs 700 and 710 in the analog buffer 926. A standard deviation of the threshold voltage of the driver TFT 700 or 710 is about 200 mV. According to Tables 2 and 3, the threshold voltage is changed by about 1V or 1000 mV, which is five times the standard deviation.

Outputs of the analog buffer 926 according to changes of the threshold voltage as shown in Tables 2 and 3 are discussed as follows.

Figure 18:
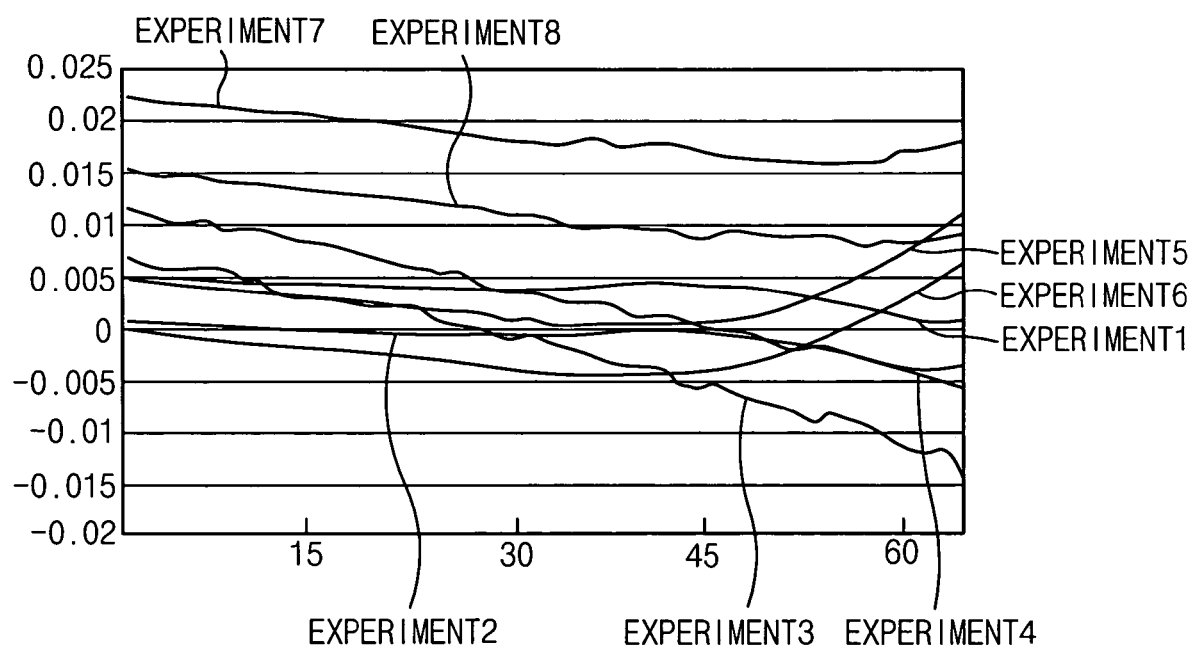
FIGS. 18 and 19 are graphs illustrating error voltages according to electric charging in a dot inversion or a column inversion under a condition of Tables 2 or 3.
Figure 19:
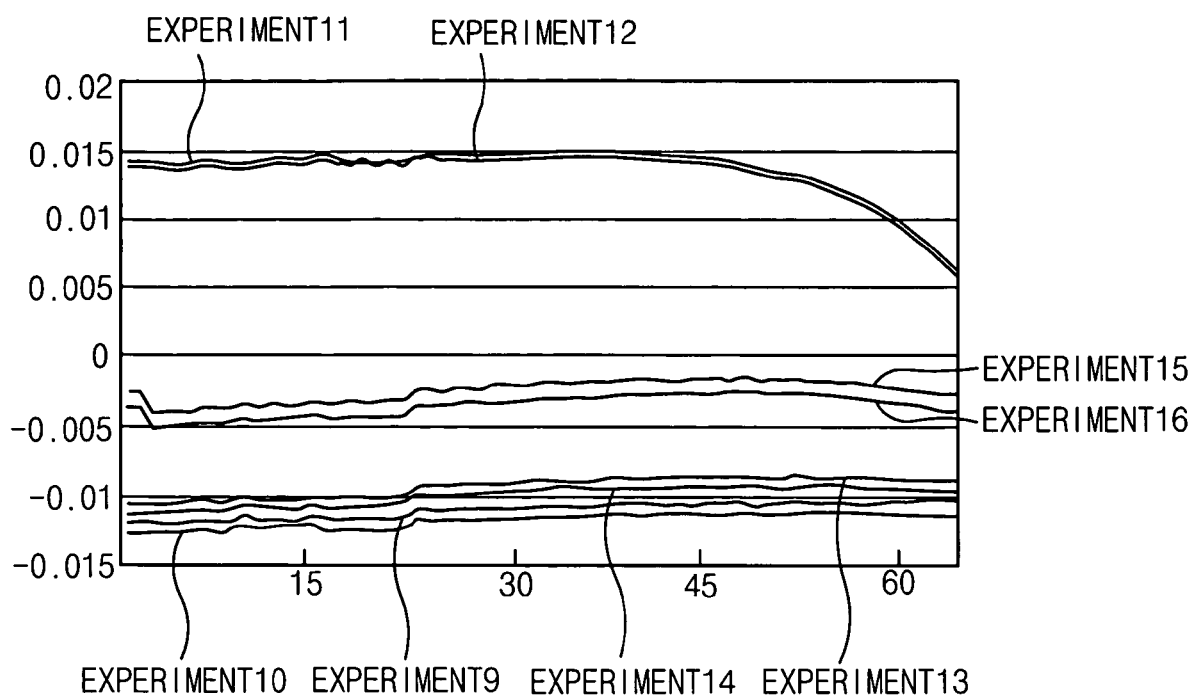
Figure 20:
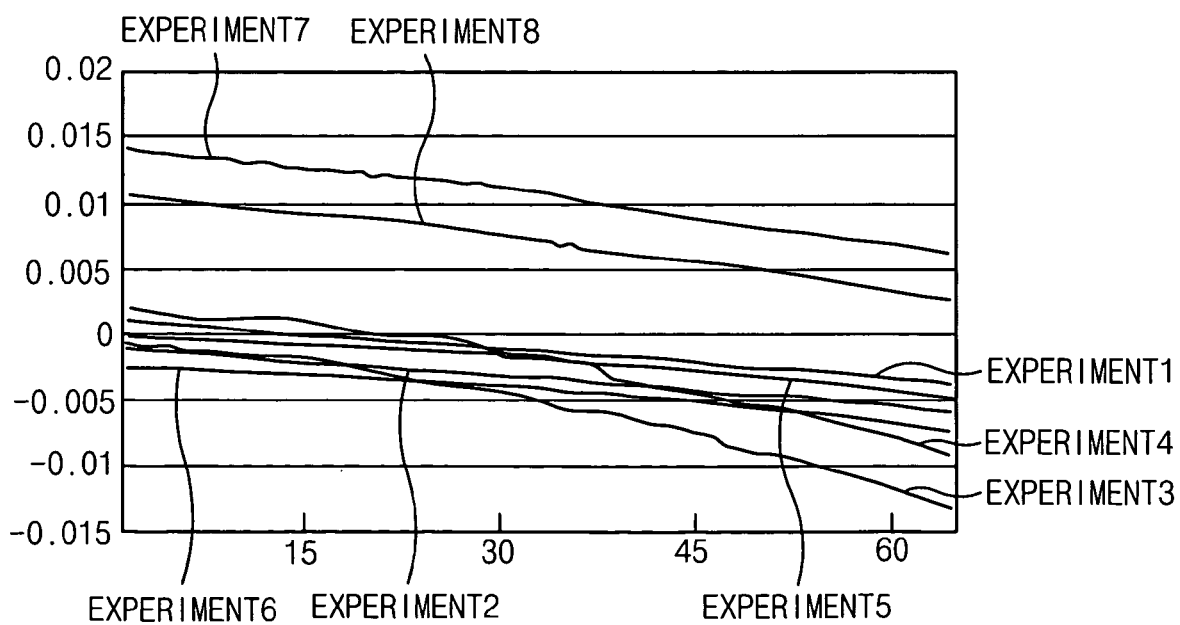
FIGS. 20 and 21 are graphs illustrating error voltages according to electric charging in a line inversion or a frame inversion under a condition of Tables 2 or 3.
Figure 21:
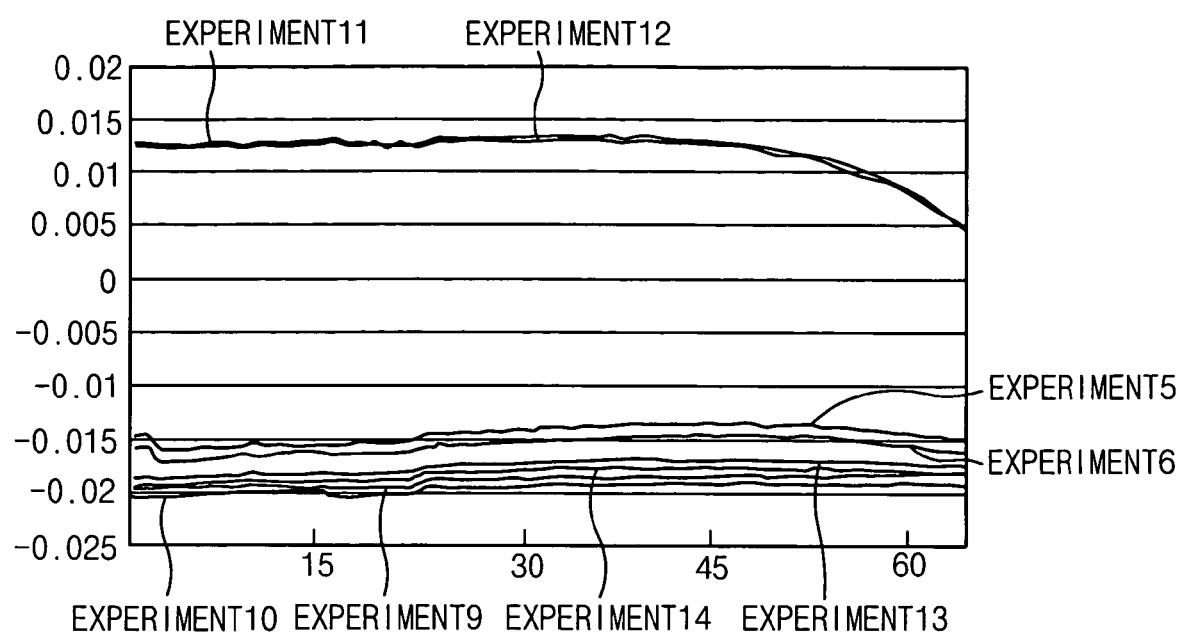

FIGS. 18 and 19 are graphs illustrating error voltages according to electric charging during a dot inversion or a column inversion under a condition of Tables 2 or 3, and FIGS. 20 and 21 are graphs illustrating error voltages according to electric charging in a line inversion or a frame inversion under a condition of Tables 2 or 3.

Referring to FIGS. 18 and 19, output voltages of the analog buffer 926 during the dot inversion or the column inversion under the conditions of the Tables 2 and 3 have a maximum deviation of about 28 mV. Referring to FIGS. 20 and 21, output voltages of the analog buffer 926 during the line inversion or the frame inversion under the conditions of the Tables 2 and 3 have a maximum deviation of about 28 mV.

As shown in FIGS. 18 through 21, even when threshold voltages have a deviation of about 1000 mV, outputs of the analog buffer 926 have a deviation of about 22 mV or about 28 mV. Therefore, display quality may be enhanced.

Figure 22:
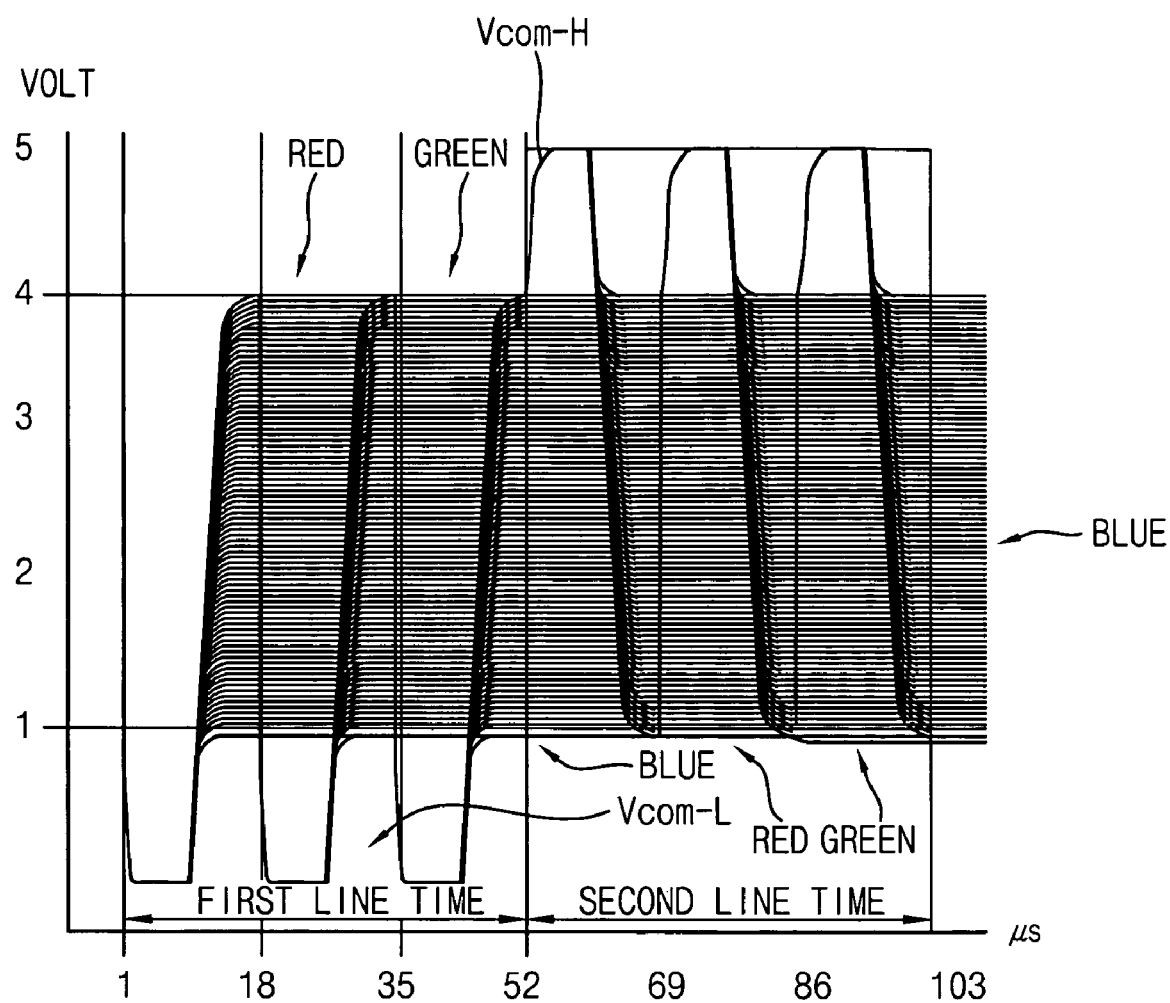
FIG. 22 is a graph illustrating outputs of an analog buffer according to an exemplary embodiment of the present invention, which is controlled by the control signal in FIG. 15.

FIG. 22 is a graph illustrating outputs of an analog buffer 926 controlled by the control signal in FIG. 15.

Referring to FIG. 22, the R-source line SL-R, the G-source line SL-G and the B-source line SL-B are electrically discharged previously by the common voltage Vcom of a low level (Vcom-L) and then the R-source line SL-R, the G-source line SL-G and the B-source line SL-B are electrically charged by the load voltage Vload that is previously set at a first line time.

The R-source line SL-R, the G-source line SL-G and the B-source line SL-B are electrically charged previously by the common voltage Vcom of a high level (Vcom-H) and then the R-source line SL-R, the G-source line SL-G and the B-source line SL-B are electrically discharged by the load voltage Vload that is previously set at the first line time.

An analog buffer according to an exemplary embodiment of the present invention includes a comparator and a driver TFT. The driver TFT is driven by the comparator and includes first and second inverters. A threshold voltage of the driver TFT is influenced by a process of manufacturing the driver TFT. However, the analog buffer operates regardless of the process of manufacturing the driver TFT, thus minimizing a variation of output voltages.

Furthermore, the analog buffer according to an exemplary embodiment of the present invention performs discharging and charging in a short time so that a plurality of source lines may be driven when one gate line is driven. Therefore, when the analog buffer is employed by a source driver circuit for a high resolution LCD panel or a source driver circuit having a demultiplexed structure, high resolution applications may be accomplished.

Furthermore, according to an exemplary embodiment of the present invention, a load that is electrically charged by a common voltage is further electrically charged by an input voltage or electrically discharged by the input voltage to reduce a number of DAC decoders and resistor lines used in the source driver. Therefore, an area of the source driver circuit may be reduced.

Having described the exemplary embodiments of the present invention, it is noted that various changes, substitutions and alterations can be made herein without departing from the spirit and scope of the invention as defined by the appended claims.

What is claimed is:

1. An analog buffer for applying an analog voltage to a load, comprising:
    a comparator for comparing an input voltage received from an external device with the analog voltage applied to the load; and
    a PMOS transistor having a first electrode that is electrically connected to a source voltage and a second electrode that is electrically connected to the load,
    wherein the comparator comprises:
    a first capacitor electrically charged first by the input voltage and then electrically discharged;
    a second capacitor for feeding back the analog voltage applied to the load when the PMOS transistor is turned on; and
    an inverter section for turning on the PMOS transistor when the first capacitor is electrically discharged and for turning off the PMOS transistor when the analog voltage that is fed back is substantially the same as the input voltage.

2. The analog buffer of claim 1, wherein the inverter section comprises:
    a first inverter having an input terminal that is electrically connected to the input voltage and an output terminal; and
    a second inverter having an input terminal that is electrically connected to the output terminal of the first inverter, and an output terminal that is electrically connected to the PMOS transistor.

3. An analog buffer for applying an analog voltage to a load, comprising:
    a comparator for comparing an input voltage received from an external device with the analog voltage applied to the load; and
    a transistor for performing one of turning on to electrically charge the load when the analog voltage is lower than the input voltage and turning on to electrically discharge the load when the analog voltage is higher than the input voltage, and for turning off when the analog voltage is substantially the same as the input voltage,
    wherein the transistor is an NMOS transistor having a first electrode that is electrically connected to a ground voltage and a second electrode that is electrically connected to the load.

4. The analog buffer of claim 3, wherein the comparator comprises:
    a first capacitor that is electrically discharged first by the ground voltage and then electrically charged by the input voltage;
    a second capacitor for feeding back the analog voltage applied to the load when the NMOS transistor is turned on; and
    an inverter section for turning on the NMOS transistor when the first capacitor is electrically charged and for turning off the NMOS transistor when the analog voltage that is fed back is substantially the same as the input voltage.

5. The analog buffer of claim 4, wherein the inverter section comprises:
    a first inverter having an input terminal that is electrically connected to the input voltage and an output terminal; and
    a second inverter having an input terminal that is electrically connected to the output terminal of the first inverter, and an output terminal that is electrically connected to the NMOS transistor.

* * * * *